(12) United States Patent
Teng et al.

(10) Patent No.: US 11,554,390 B2
(45) Date of Patent: Jan. 17, 2023

(54) ULTRASONIC/MEGASONIC CLEANING DEVICE

(71) Applicant: BEIJING SEVENSTAR ELECTRONICS CO., LTD., Beijing (CN)

(72) Inventors: Yu Teng, Beijing (CN); Yi Wu, Beijing (CN)

(73) Assignee: BEIJING SEVENSTAR ELECTRONICS CO., LTD., Beijing (CN)

( * ) Notice: Subject to any disclaimer, the term of this patent is extended or adjusted under 35 U.S.C. 154(b) by 0 days.

(21) Appl. No.: 17/020,217

(22) Filed: Sep. 14, 2020

(65) Prior Publication Data

US 2020/0406312 A1     Dec. 31, 2020

Related U.S. Application Data

(63) Continuation-in-part of application No. 15/663,667, filed on Jul. 28, 2017, now abandoned.

(30) Foreign Application Priority Data

Aug. 26, 2016    (CN) ......................... 201610739227.7
Aug. 26, 2016    (CN) ......................... 201610739229.6

(Continued)

(51) Int. Cl.
    *B08B 3/12*         (2006.01)
    *B06B 1/06*         (2006.01)

(52) U.S. Cl.
    CPC .. *B08B 3/12* (2013.01); *B06B 1/06* (2013.01)

(58) Field of Classification Search
    CPC .... B08B 3/02; B08B 3/08; B08B 3/12; B08B 2209/005; H01L 21/02041;
(Continued)

(56) References Cited

U.S. PATENT DOCUMENTS 3,221,266 A    11/1965   Vitkovits
6,822,372 B2   11/2004   Puskas
(Continued)

FOREIGN PATENT DOCUMENTS

CN        104646350 A     5/2015

OTHER PUBLICATIONS

Machine Translation of Wu et al., CN-104646350-A, May 2015. (Year: 2015).

*Primary Examiner* — David G Cormier
(74) *Attorney, Agent, or Firm* — Anova Law Group, PLLC

(57) ABSTRACT

An ultrasonic/megasonic cleaning device includes a cleaning unit including an upper casing and a lower casing connected to form a hollow chamber, an ultrasonic/megasonic generator provided in the hollow chamber, and a bottom quartz component provided with a quartz rod array composed of a plurality of vertically arranged quartz rod-like structures; a spray arm connected to the upper casing; and an ultrasonic/megasonic frequency control unit connected between the at least one signal source and the ultrasonic/megasonic generator, for constantly varying a frequency of the electrical signal output from the at least one signal source and introducing the electrical signal into the ultrasonic/megasonic generator, so as to dynamically vary an oscillation frequency of the ultrasonic/megasonic wave generated by the ultrasonic/megasonic generator; wherein the ultrasonic/megasonic frequency control unit includes a frequency-switching timing control unit configured to trigger am ultrasonic/megasonic frequency switching control unit to switch the oscillation frequency of the ultrasonic/megasonic wave from a first frequency to a second frequency when the ultrasonic/megasonic wave has been generated at the first (Continued)

frequency for a time period, the time period being randomly selected within a time range.

18 Claims, 19 Drawing Sheets

(30) Foreign Application Priority Data

Aug. 26, 2016 (CN) .......................... 201610740339.4
Aug. 26, 2016 (CN) .......................... 201610740883.9
Aug. 26, 2016 (CN) .......................... 201610741151.1

(58) Field of Classification Search
CPC ......... H01L 21/02043; H01L 21/02057; H01L 21/67023; H01L 21/67051; H01L 21/67057; A61L 2/02; A61L 2/025
See application file for complete search history.

(56) References Cited

U.S. PATENT DOCUMENTS

| | | |
|---|---|---|
| 2004/0025911 A1 | 2/2004 | Yeo et al. |
| 2014/0043944 A1 | 2/2014 | Wilt et al. |

ULTRASONIC/MEGASONIC CLEANING DEVICE

CROSS-REFERENCE TO RELATED APPLICATION

This application is a continuation-in-part application of U.S. patent application Ser. No. 15/663,667, filed on Jul. 28, 2017, which claims the priority benefit of Chinese Patent Applications No. 201610740339.4, No. 201610740883.9, No. 201610739229.6, No. 201610739227.7 and No. 201610741151.1, filed Aug. 26, 2016, the disclosures of all of which are incorporated herein by reference.

TECHNICAL FIELD

The present disclosure generally relates to the field of semiconductor integrated circuit cleaning device, more particularly, to an ultrasonic/megasonic cleaning device for cleaning wafers without damaging patterns formed on the wafer.

BACKGROUND

With the continuous scale down of the critical dimensions of IC devices, the removal of the micro contaminants on wafer surfaces is becoming more difficult. Many new cleaning techniques have been applied to modern cleaning equipment. Among them, the most important one is the ultrasonic/megasonic cleaning technology. However, although the ultrasonic/megasonic cleaning technology can improve the removal efficiency of contaminants, it is prone to damage the pattern structures on the wafer.

China Patent Application No. 201510076158.1 discloses a non-destructive cleaning device for wafers, which comprises a hollow casing suspended above a target wafer, an ultrasonic generator provided inside the hollow casing, and a selective ultrasonic-energy removal mechanism connected with the lower end of the ultrasonic generator. The selective ultrasonic-energy removal mechanism comprises an array of multiple quartz rods of the same height which are vertically arranged in a spaced manner. The quartz rods extend out from the lower side of the casing to be submerged into a cleaning solution covering the target wafer, thus to selectively eliminate the ultrasonic energy generated from the ultrasonic generator which propagates in a direction non-vertical to the wafer surface and ensure the ultrasonic energy to be vertically propagated to the target wafer. As a result, damages to the patterns on the wafer surface during the ultrasonic cleaning will not occur, which achieves the non-destructive ultrasonic cleaning for the target wafer and effectively improves the removal efficiency of the contaminants on the wafer surface.

However, according to the above-described conventional ultrasonic/megasonic cleaning technique, the ultrasonic/megasonic energy is generated from a high-speed oscillation of an electrical signal of a single frequency introduced into a piezoelectric material of the ultrasonic generator. During the ultrasonic/megasonic cleaning, the ultrasonic/megasonic energy is refracted and reflected on the upper and lower surfaces of the target wafer, as well as at the contact surfaces of other different components within the cleaning chamber. These refracted and reflected ultrasonic/megasonic waves interfere with the ultrasonic/megasonic wave oscillating at the single frequency transmitted from the piezoelectric material, such interference may cause the energy in local areas of the wafer to be too strong, resulting in damages to the fine pattern structures on the wafer surface.

On the other hand, the ultrasonic/megasonic wave produces cavitation and acoustic streaming in the cleaning solution to accelerate the separation process of the particulate contaminants from the wafer surface, thereby improving the cleaning efficiency. However, from the practical experience in the industry, the physical energy caused by the implosion of the cavitation bubbles is difficult to control, which is prone to result in cavitation erosions to the fine pattern structures on the wafer surface. Therefore, the technical artisan in the industry would like to utilize the acoustic streaming to perform the non-destructive cleaning for the wafer.

Therefore, a new technical means to control the cavitation erosions is needed, in order to achieve a better non-destructive cleaning for the wafer.

SUMMARY

The object of the present disclosure is to provide an ultrasonic/megasonic cleaning device, which can eliminate the destructive effects of the ultrasonic/megasonic energy propagating in directions non-perpendicular to the wafer surface during the ultrasonic/megasonic cleaning of the wafer, and dynamically tune the vibration frequency of the ultrasonic/megasonic wave in the cleaning solution to prevent permanent interference and bubble implosion as well as to control the cavitation erosions, so as to clean the wafer without damage.

The invention has the following advantages:

1) The ultrasonic/megasonic energy in other directions is eliminated by the quartz rod array at the bottom quartz component, which ensures the ultrasonic/megasonic energy to be conducted vertically to the cleaning solution on the wafer surface to avoid damages to the pattern structures on the wafer surface during the ultrasonic/megasonic cleaning.

2) During the ultrasonic/megasonic cleaning, the frequency of the ultrasonic/megasonic wave generated by the ultrasonic/megasonic generator is dynamically changed, which prevents the occurrence of sustained interference; moreover, with the variation of the frequency of the ultrasonic/megasonic wave generated by the ultrasonic/megasonic generator, the wavelength of the ultrasonic/megasonic wave also changes accordingly. For example, just before the bubbles produced by the ultrasonic/megasonic wave growing to a maximum size to implode, the frequency of the ultrasonic/megasonic wave has already been changed and new bubbles are created at other locations, while the previous bubbles will not grow further or implode. In the course of such cycles, as the frequency of the ultrasonic/megasonic wave changes, the bubbles are generated and disappeared constantly without implosion, which prevents damages to the fine pattern structures on the wafer surface due to the cavitation erosions caused by the bubble implosion. The timing of the frequency switching may be controlled by a frequency-switching timing control unit. The time period for switching may be randomly selected within a time range. The time range may be configured according to a bubble monitor. The time range may be configured so that the time period for switching is guaranteed to be below a time length between bubbles being generated and growing to a maximum size to implode in the cleaning solution under the effect of the ultrasonic/megasonic wave at the first frequency. Further, since switching timing is randomly selected within the time range instead of being selected at a fixed time interval, no sustained interference is formed. That is, the arrangement of the frequency-switching timing control unit not only guarantees that the ultrasonic/megasonic wave switches frequencies before bubbles are ruptured, but also guarantees that no sustained interferences are formed.

According to one aspect of the present disclosure, an ultrasonic/megasonic cleaning device is provided. The device includes: a cleaning unit comprising: an upper casing and a lower casing, the upper casing and the lower casing being connected to form a hollow chamber, the hollow chamber being provided with an opening at a bottom surface of the lower casing; an ultrasonic/megasonic generator provided in the hollow chamber with a space formed between an upper portion and side portion of the ultrasonic/megasonic generator and an inner wall of the hollow chamber; wherein, the ultrasonic/megasonic generator including a piezoelectric material connected to at least one signal source outside the cleaning unit, for receiving an electrical signal output from the at least one signal source and generating an ultrasonic/megasonic wave; and a bottom quartz component provided with a quartz rod array composed of a plurality of vertically arranged quartz rod-like structures; wherein, the quartz rod array extends out from the opening at the bottom surface of the lower casing for conducting the ultrasonic/megasonic wave vertically downward to a cleaning solution on a surface of a wafer; a spray arm connected to the upper casing; wherein, the spray arm is driven by a rotary motor to enable the cleaning unit to perform an arc reciprocating motion above the surface of the wafer passing through a center of the wafer; and an ultrasonic/megasonic frequency control unit connected between the at least one signal source and the ultrasonic/megasonic generator, for constantly varying a frequency of the electrical signal output from the at least one signal source and introducing the electrical signal into the ultrasonic/megasonic generator, so as to dynamically vary an oscillation frequency of the ultrasonic/megasonic wave generated by the ultrasonic/megasonic generator; wherein the ultrasonic/megasonic frequency control unit includes a frequency-switching timing control unit configured to trigger an ultrasonic/megasonic frequency switching control unit to switch the oscillation frequency of the ultrasonic/megasonic wave from a first frequency to a second frequency when the ultrasonic/megasonic wave has been generated at the first frequency for a time period, the time period being randomly selected within a time range.

According to another aspect of the present disclosure, an ultrasonic/megasonic cleaning method is provided. The method includes: generating an ultrasonic/megasonic wave by an ultrasonic/megasonic generator of a cleaning unit, and applying the generated ultrasonic/megasonic wave vertically downward to a cleaning solution on a surface of a wafer; driving the cleaning unit to perform an arc reciprocating motion above the surface of the wafer passing through a center of the wafer; constantly varying a frequency of the generated ultrasonic/megasonic wave by an ultrasonic/megasonic frequency control unit connected between the a signal source and the ultrasonic/megasonic generator, wherein the ultrasonic/megasonic frequency control unit includes a frequency-switching timing control unit configured to trigger an ultrasonic/megasonic frequency switching control unit to switch the oscillation frequency of the ultrasonic/megasonic wave from a first frequency to a second frequency when the ultrasonic/megasonic wave has been generated at the first frequency for a time period, the time period being randomly selected within a time range.

BRIEF DESCRIPTION OF THE DRAWINGS

In order to more clearly illustrate the technical solutions in the embodiments of the present disclosure, the drawings used in the description of the embodiments will be briefly described below. It is obvious that the drawings in the following description are only some embodiments of the present disclosure. Other drawings may be obtained by those of ordinary skill in the art based on these drawings.

DETAILED DESCRIPTION

Reference will now be made in detail to the present preferred embodiments to provide a further understanding of the invention. The figures referred to are not necessarily drawn to scale, should be understood to be enlarged or distorted or simplified relative to others to facilitate explanation and understanding. The specific embodiments and the accompanying drawings discussed are merely illustrative of specific ways to make and use the invention, and do not limit the scope of the invention or the appended claims.

Figure 1:
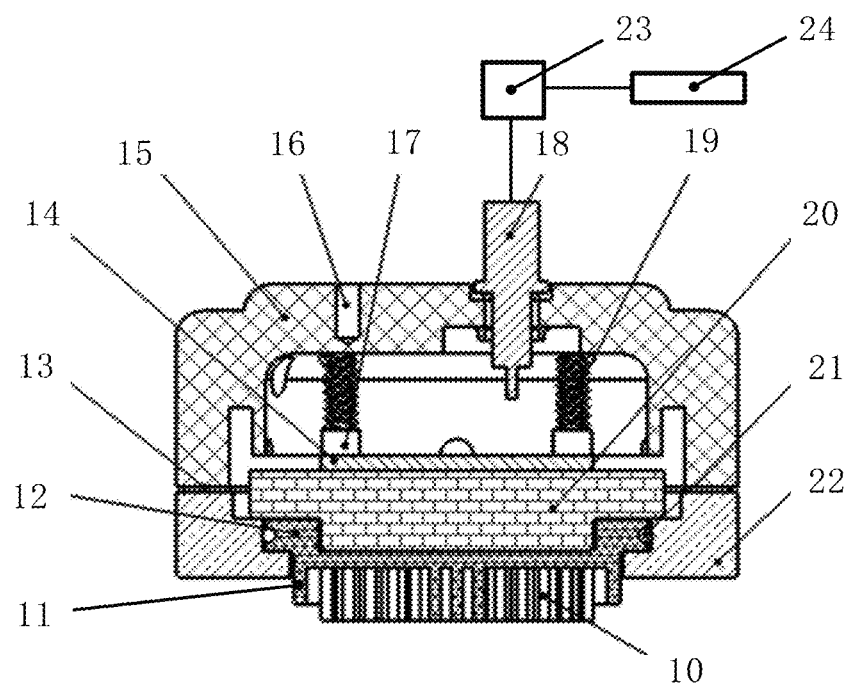
FIG. 1 is a schematic structural view of an ultrasonic/megasonic cleaning device according to one embodiment of the present disclosure.

Refer to FIG. 1, which is a schematic structural view of an ultrasonic/megasonic cleaning device according to one embodiment of the present disclosure. As shown in FIG. 1, the ultrasonic/megasonic cleaning device is movably disposed in a cleaning chamber of a cleaning equipment and above a wafer to perform ultrasonic/megasonic cleaning to the wafer. The wafer is arranged on a rotating chuck in the cleaning chamber. The ultrasonic/megasonic cleaning device includes a cleaning unit, an ultrasonic/megasonic frequency control unit 23, and a spray arm (not shown). The cleaning unit includes an upper casing 15, a lower casing 22, an ultrasonic/megasonic generator mounted within the upper casing and the lower casing, and a bottom quartz component 12. The upper casing 15 and the lower casing 22 can be connected in a detachable manner. For example, the upper casing and the lower casing can be fixedly connected by bolts, and then a hollow chamber is formed inside thereof after connection. The hollow chamber has an opening at a bottom surface of the lower casing 22. In order to ensure the sealing performance of the upper casing and the lower casing after installation, a gasket 13 can be provided between the joint portions of the upper casing and the lower casing.

Please referring to FIG. 1, the ultrasonic/megasonic generator and the bottom quartz component 12 are provided within the hollow chamber. A space is formed between the upper portion and the side portion of the ultrasonic/megasonic generator and the inner wall of the hollow chamber, thereby forming a cooling chamber. The ultrasonic/megasonic generator comprises a piezoelectric material 14 which is connected to at least one signal source 24 outside the cleaning unit. The bottom quartz component 12 is attached to the bottom of the ultrasonic/megasonic generator in a close-fitting manner. The bottom quartz component 12 is provided with a quartz rod array 10 at its lower end, which is composed of a plurality of vertically arranged quartz rod-like structures. The quartz rod array 10 extends out from the opening at the bottom surface of the lower casing.

Figure 2:
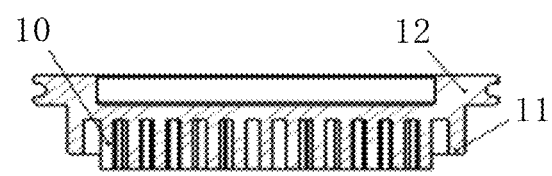
FIG. 2 is a cross-sectional view of the bottom quartz component and structures below the bottom quartz component in FIG. 1.
Figure 3:
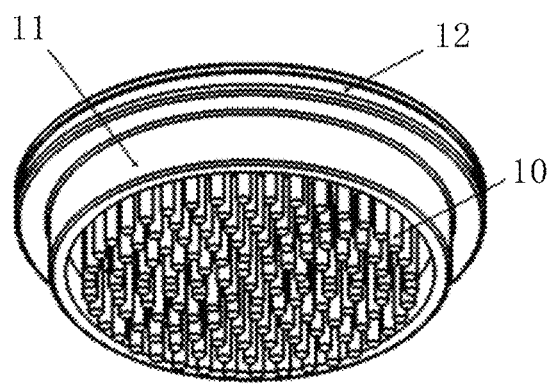
FIG. 3 is a schematic perspective view of the bottom quartz component and structures below the bottom quartz component in FIG. 1.

Please refer to FIG. 2 and FIG. 3. FIG. 2 is a cross-sectional view of the bottom quartz component. FIG. 3 is a schematic perspective view of the bottom quartz component. As shown in FIGS. 2 and 3, in this embodiment, the bottom quartz component 12 has a circular shape, the bottom surfaces of the quartz rod-like structures of the quartz rod array 10 have the same height. Furthermore, the quartz rod-like structures are evenly spaced from each other. The size of the quartz rod-like structure can be between 0.5 and 5 mm in diameter and 2 mm or more in length, which is configured according to the required frequency of the ultrasonic/megasonic wave. The amount and distribution density of the quartz rod-like structures can also be configured according to actual needs and processing capabilities.

In order to effectively protect the quartz rod array, an annular protective ring 11 which encloses the quartz rod array 10 can be provided at the lower end of the bottom quartz component 12. In a preferred embodiment, the annular protective ring 11 can be integrally formed with the bottom quartz component 12.

During its installation and commissioning processes with the quartz rod array 10, the annular protective ring 11 can be held by hand to avoid damages to the quartz rod-like structures due to the direct contact between the annular protective ring 11 and the quartz rod-like structures.

As shown in FIG. 1, the top of the bottom quartz component 12 is in close fitting contact with the bottom portion of the ultrasonic/megasonic generator. Moreover, the side portion of the bottom quartz component 12 is stepped fit to the inner wall of the hollow chamber at the lower casing 22. A sealing ring 21 is provided between the lower casing 22 and the bottom quartz component 12 in order to ensure the sealing performance between the lower casing 22 and the bottom quartz component 12 after installation.

The lower end of the annular protective ring 11 is a free end, which extends out together with the lower end of the quartz rod array from the opening at the bottom surface of the lower casing. The bottom surface of the quartz rod array 10 should be at a lower or the same height as the bottom surface of the annular protective ring 11. In another word, the bottom surface of the quartz rod array 10 is not higher than the bottom surface of the annular protective ring 11. As shown in the figure, the bottom surface of the quartz rod array 10 is below the bottom surface of the annular protective ring 11.

The ultrasonic/megasonic generator can be an ultrasonic/megasonic generator based on a piezoelectric material. In the present embodiment, the ultrasonic/megasonic generator includes a piezoelectric material 14 and a coupling layer 20 which are closely contact with each other in the vertical direction. The coupling layer 20 can be made of metal. The lower portion of the coupling layer 20 is closely fitted to the upper portion of the annular protective ring 11. In order to ensure an effective and accurate connection, the lower portion of the coupling layer 20 and the upper portion of the bottom quartz component 12 are engaged in a concave-convex manner as shown in the figure. A certain space is formed between the sides of the coupling layer 20, the side and top portions of the piezoelectric material 14, and the inner wall of the hollow chamber to facilitate gas cooling.

Between the top of the inner wall of the upper casing 15 and the piezoelectric material 14, a plurality of compression springs 19 and compression spring guideposts 17 are sequentially provided. Under the guidance of the compression spring guideposts 17, the compression springs 19 press down the piezoelectric material 14 and the coupling layer 20 in the vertical direction to make the coupling layer 20 contact the annular protective ring 11 and the lower casing 22 with no gap, so that the ultrasonic/megasonic energy can be transmitted effectively.

The upper casing is provided with a piezoelectric material binding post 18. The piezoelectric material binding post 18 is connected between the signal source 24 and the piezoelectric material 14, and a binding post of the coupling layer is connected between the coupling layer and the signal source 24. As a result, a circuit loop is formed, and the piezoelectric material binding post 18 can introduce an electrical signal generated from the external signal source 24 to the piezoelectric material 14. The piezoelectric material 14 vibrates at high speed after receiving the electrical signal to generate ultrasonic/megasonic oscillation energy, and conducts the ultrasonic/megasonic oscillation energy downward into the coupling layer 20.

The coupling layer 20 can be made of a single metallic material or a plurality of metallic materials. The coupling layer 20 has a thickness approximately equaling to an integer number plus one-quarter wavelengths of the ultrasonic/megasonic wave generated by the piezoelectric material. The coupling layer 20 may be bonded to the piezoelectric material 14 by a conducting resin. The surfaces of the piezoelectric material 11 and coupling layer 20 can be coated with a corrosion-resistant layer, thus to prevent the cleaning solution corroding the metallic material of the coupling layer and the piezoelectric material.

The coupling layer 20 and the bottom quartz component 12 can be connected by a conducting resin, a metal alloy with low-melting point, or a soft metal sheet like gold or silver to ensure a seamless connection.

Figure 4:
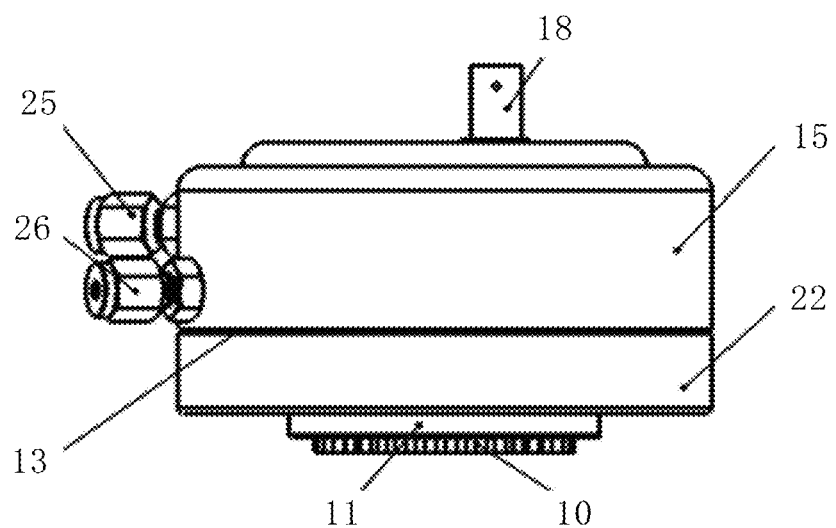
FIG. 4 is a schematic view illustrating the external configuration of the cleaning unit of the ultrasonic/megasonic cleaning device in FIG. 1.

Refer to FIG. 4, which is a schematic view showing the external configuration of the cleaning unit of the ultrasonic/megasonic cleaning device in FIG. 1 (the ultrasonic/megasonic frequency control unit and the signal source are omitted). As shown in FIG. 4, the upper casing 15 is provided with a cooling gas inlet 25 and a cooling gas outlet 26, which are communicated with a cooling chamber composed of the inner wall of the hollow chamber and the outer wall of the ultrasonic/megasonic generator. The cooling gas can be introduced into the internal cavity of the cleaning unit and discharged from the cooling gas outlet 26 after performing a heat exchange with the ultrasonic/megasonic generator, thus to effectively cool the ultrasonic/megasonic generator.

Figure 5:
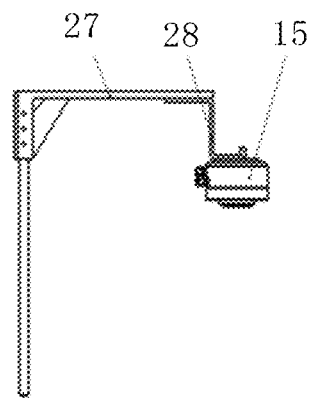
FIG. 5 is a schematic view illustrating a fitting state of the cleaning unit and the spray arm according to one embodiment of the present disclosure.

FIG. 5 is a schematic view illustrating a fitting state of the cleaning unit and the spray arm of the present disclosure. As shown in FIG. 5, the spay arm 27 is connected to the upper casing 15 of the cleaning unit through a fixing supporter 28, and is rotated by a rotating motor (not shown), so as to drive the cleaning unit to perform an arc reciprocating motion above the surface of the wafer to clean the wafer with uniform ultrasonic/megasonic energy. The fixing supporter 28 can be fixed to the upper casing 15 through a bolt hole 16 formed at the top of the upper casing 15.

Please refer to FIG. 1. The ultrasonic/megasonic frequency control unit 23 is connected between the at least one signal source 24 and the piezoelectric material 14. For example, the ultrasonic/megasonic frequency control unit 23 can be mounted outside the casing of the cleaning unit, one end of the ultrasonic/megasonic frequency control unit 23 is connected to the at least one signal source 24 and the other end is connected to the piezoelectric material 14 of the ultrasonic/megasonic generator within the casing. The electrical signal output from the at least one signal source 24 is introduced into the piezoelectric material 14 through the ultrasonic/megasonic frequency control unit 23. The ultrasonic/megasonic frequency control unit 23 constantly changes the frequency of the electrical signal, such that the oscillation frequency of the ultrasonic/megasonic wave generated by the ultrasonic/megasonic generator is dynamically varied accordingly, which prevents permanent interference and bubble implosion in the cleaning solution.

Figure 6A:
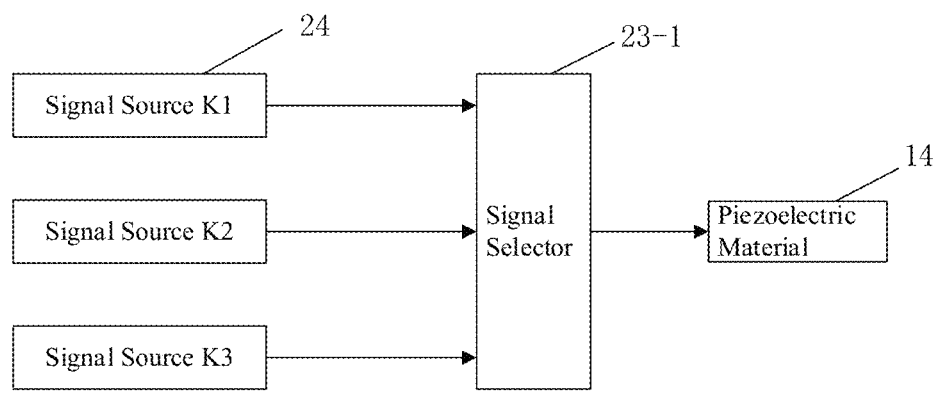
FIGS. 6a-6d are schematic diagrams illustrating different control principles of the ultrasonic/megasonic frequency control unit of the ultrasonic/megasonic cleaning device in FIG. 1.

Please refer to FIGS. 6a-6d, which are schematic diagrams illustrating different control principles of the ultrasonic/megasonic frequency control unit. As shown in FIG. 6a, multiple signal sources 24 are provided; the ultrasonic/megasonic frequency control unit comprises a signal selector 23-1 with one end connected to the piezoelectric material 14 via the piezoelectric material binding post 18 and the other end connected to of the multiple signal sources 24. Wherein at least one of the signal sources 24 generates an electrical signal having the same frequency as the natural frequency of the piezoelectric material, and other signal sources generate electrical signals with frequencies shifted relative to the natural frequency of the piezoelectric material. Preferably, the shifted frequencies comprise both positive and negative shifted frequencies relative to the natural frequency of the piezoelectric material. As shown in FIG. 6a, the frequency of the electrical signal generated by the signal source K2 is the same as the natural frequency of the piezoelectric material 14, and the frequencies of the electrical signals generated by the other two signal sources K1, K3 are shifted positively and negatively near the natural frequency of piezoelectric material 14. The shifted value can be between 1% to 5%. For example, the frequency of the electrical signal generated by the signal source K2 coincides with the natural frequency of the piezoelectric material 14 of 1 MHz, whereas the frequency of the electrical signal generated by the signal source K1 is negatively shifted from that of the electrical signal generated by the signal source K2 to be 980 kHz, the frequency of the electrical signal generated by the signal source K3 is positively shifted from that of the electrical signal generated by the signal source K2 to be 1020 kHz.

The signal selector 23-1 can change the frequency of the electrical signal applied to the piezoelectric material 14 in real time by switching rapidly between the signal sources K1 to K3, such that the oscillation frequency of the ultrasonic/megasonic wave generated by the piezoelectric material 14 can be dynamically changed.

Preferably, the switching interval of the signal selector 23-1 can be controlled in a range from a few microseconds to several hundred microseconds to ensure that the bubbles produced by the ultrasonic/megasonic wave according to the electrical signal from a preceding signal source do not have sufficient time to grow and implode.

Although partial energy loss may occur due to the inconsistence between the frequencies of the electrical signals generated by the signal sources K1 and K3 and the natural frequency of the piezoelectric material, such loss is acceptable as long as the whole device can finally realize the non-destructive cleaning to the fine pattern structures on the wafer surface.

Figure 6B:
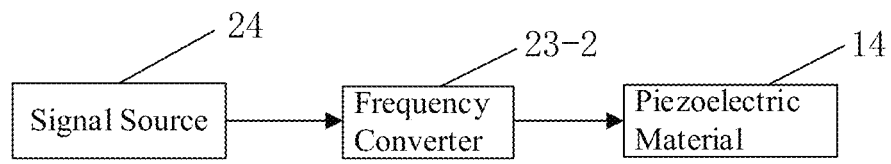

As shown in FIG. 6b, in another embodiment, only one signal source is provided, the ultrasonic/megasonic frequency control unit comprises a frequency converter 23-2, having one end connected to the piezoelectric material 14 via the piezoelectric material binding post and the other end connected to the signal source 24. The signal source 24 generates the electrical signal with an original frequency as same as the natural frequency of the piezoelectric material 14, then the frequency converter 23-2 constantly changes the original frequency of the electrical signal generated by the signal source 24 to be shifted relative to the natural frequency positively and negatively to output multiple electrical signals with different frequencies at different time. For example, among the multiple electrical signals output by the frequency converter, at least one electrical signal has a frequency as same as the natural frequency of the piezoelectric material 14, while the other electrical signals have frequencies offset positively and negatively with respect to the natural frequency of the piezoelectric material. As a result, the oscillation frequency of the ultrasonic/megasonic wave generated by the piezoelectric material 14 is dynamically changed.

Preferably, the switching interval of the frequency converter 23-2 can be controlled in a range from a few microseconds to several hundred microseconds to ensure that the bubbles produced by the ultrasonic/megasonic wave with a preceding oscillation frequency do not have sufficient time to grow and implode.

In this way, partial energy loss may occur due to the inconsistence between the frequencies of the electrical signals introduced to the piezoelectric material and the natural frequency of the piezoelectric material. Nevertheless, only one piezoelectric material is needed, which simplifies the production process of the piezoelectric material and reduces the production cost.

Figure 6C:
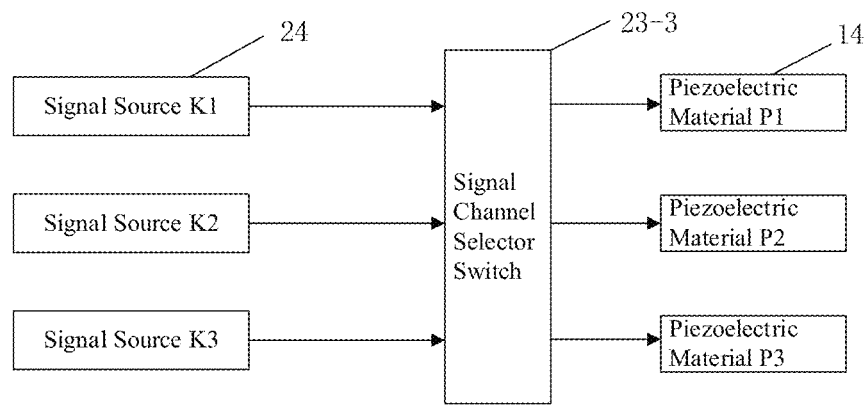

As shown in FIG. 6c, in another embodiment, the ultrasonic/megasonic frequency control unit comprises a signal channel selection switch 23-3. The piezoelectric material comprises a plurality of sub-materials having different natural frequencies. Furthermore, the same number of signal sources 24 as the sub-materials are provided. The signal sources 24 are connected one-to-one correspondingly to the plurality of sub-materials of the piezoelectric material 14. Each signal source can output an electrical signal having a frequency as same as the natural frequency of a corresponding sub-material of the piezoelectric material 14. The communication channel between each signal source and its corresponding sub-material is controlled by the signal channel selection switch 23-3. In the present embodiment, three signal sources K1 to K3 generating electrical signals with different frequencies are provided, corresponding to three sub-materials P1 to P3 with three different natural frequencies, respectively. The signal channel selection switch 23-3 only switches on one communication channel between a signal source and its corresponding sub-material at each time, and switches off the other communication channels. It is noted that, the communication channels between the signal sources and their corresponding sub-materials are switched on randomly according to a specific algorithm so that the oscillation frequency of the ultrasonic/megasonic wave generated by the piezoelectric material 14 is dynamically changed.

Preferably, the switching interval of the signal channel selection switch 23-3 can be controlled in a range from a few microseconds to several hundred microseconds to ensure that the bubbles produced by the ultrasonic/megasonic wave according to the electrical signal from a preceding signal source do not have sufficient time to grow and implode.

In the above-mentioned solution, a plurality of sub-materials of the piezoelectric material having different natural frequencies are employed one-to-one corresponding to the signal sources. This prevents the energy loss due to the inconsistence between the natural frequency of a single piezoelectric material and the frequencies of the electrical signals generated by the signal sources.

Figure 6D:
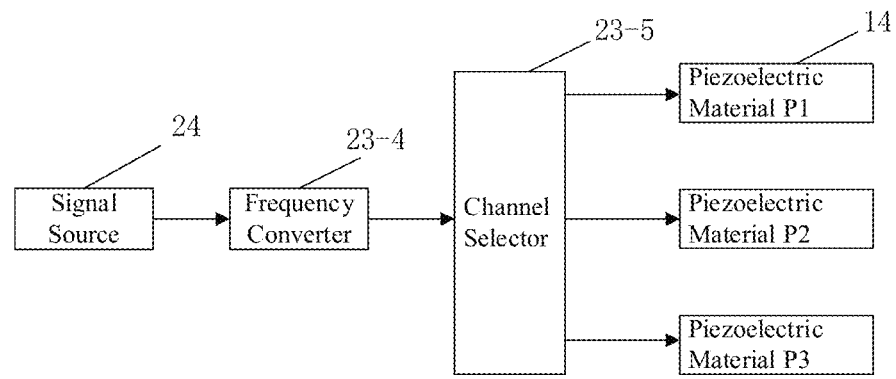
Figure 7A:
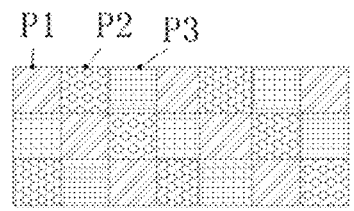
FIGS. 7a-7e are schematic views illustrating configurations of the piezoelectric material with different natural frequencies as shown in FIG. 6c and FIG. 6d.
Figure 7B:
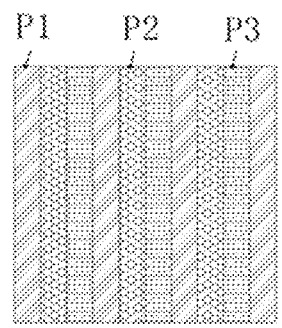
Figure 7C:
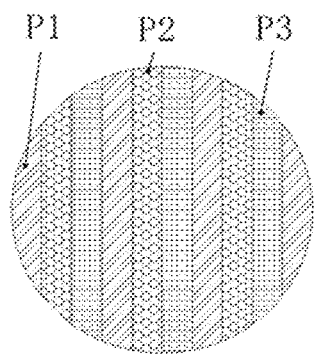
Figure 7D:
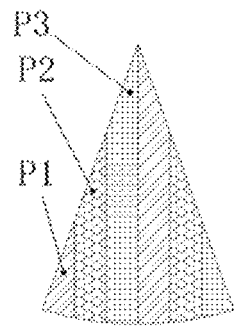
Figure 7E:
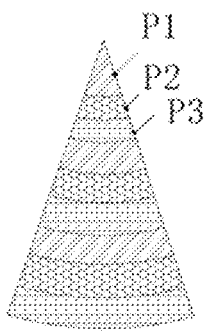

As shown in FIG. 6d, in another embodiment, only one signal source 24 is provided, the piezoelectric material comprises a plurality of sub-materials having different natural frequencies, the ultrasonic/megasonic frequency control unit comprises a frequency converter 23-4 and a channel selector 23-5 connected between the signal source 24 and the plurality of sub-materials. In the present solution, one single signal source 24 and three sub-materials P1-P3 of the piezoelectric material with different natural frequencies are provided. The frequency converter 23-4 receives the electrical signal from the signal source 24 and changes the frequency of the electrical signal to output several electrical signals with different frequencies which are respectively equal to the natural frequencies of the sub-materials P1 to P3 at different time. The channel selector 23-5 is connected between the frequency converter 23-4 and the sub-materials P1-P3 to switch on the communication channel to the sub-material P1 or P2 or P3 whose natural frequency is the same as the frequency of the electrical signal output from the frequency converter 23-4, so that the oscillation frequency of the ultrasonic/megasonic wave generated by the piezoelectric material 14 is dynamically changed.

Preferably, the switching interval of the signal frequency converter 23-4 can be controlled in a range from a few microseconds to several hundred microseconds to ensure that the bubbles produced by the ultrasonic/megasonic wave with a preceding oscillation frequency do not have sufficient time to grow and implode. Similarly, the channel selector 23-5 is required to switch on the corresponding communication channel immediately after the frequency converter 23-4 completing a frequency switch. That is, the frequency converter and the channel selector are required to have similar switching intervals at the same orders of magnitude to achieve the dynamic variation of the oscillation frequency of the ultrasonic/megasonic wave.

FIGS. 7a-7e are schematic views of different configurations of the piezoelectric material with different natural frequencies as shown in FIGS. 6c and 6d. As shown in FIGS. 7a-7e, the sub-materials with different natural frequencies of the piezoelectric material, such as sub-materials P1-P3, are integrated as a whole in the ultrasonic/megasonic cleaning device. The specific integration configuration may be determined according to the actual shape of the ultrasonic/megasonic cleaning device. As shown in FIGS. 7a-7e, when the shape of the cleaning unit (i.e., the horizontal profile of the casing) is rectangle, square, circle or sector, the integrated sub-materials P1-P3 has a corresponding rectangular, square, circular, or sector shape.

In the embodiments illustrated by FIGS. 6a-6d, the frequency of the electrical signal introduced into the piezoelectric material is varied by using multiple signal sources instead of one single signal source or by changing the frequency of the electrical signal output from one single signal source, such that the oscillation frequency of the ultrasonic/megasonic wave output by the ultrasonic/megasonic frequency control unit can be dynamically changed and permanent interference can be prevented. Moreover, with the variation of the oscillation frequency of the ultrasonic/megasonic wave, the wavelength of the ultrasonic/megasonic wave also changes accordingly. Therefore, just before the bubbles produced by the ultrasonic/megasonic wave growing to a maximum size to implode, the oscillation frequency of the ultrasonic/megasonic wave has already been changed and new bubbles are created at other locations, while the previous bubbles will not grow further or implode. In the course of such cycles, as the oscillation frequency of the ultrasonic/megasonic wave changes, the bubbles are generated and disappeared constantly without implosion, which prevents damages to the fine pattern structures on the wafer surface due to the cavitation erosions caused by the bubble implosion.

According to certain embodiments, the present disclosure also provides a process and corresponding components to control a timing of switching the ultrasonic/megasonic frequency from a first frequency to a second frequency. Furthermore, according to certain embodiments, the present disclosure provides a process and corresponding components to monitor bubble generation and expansion in the cleaning liquid, so that frequency switching may be selected and controlled to occur before the bubbles produced by the ultrasonic/megasonic wave are growing to a maximum size to implode, so that the existing bubbles do not grow further to implode, while new bubbles are created at other locations.

Figure 28:
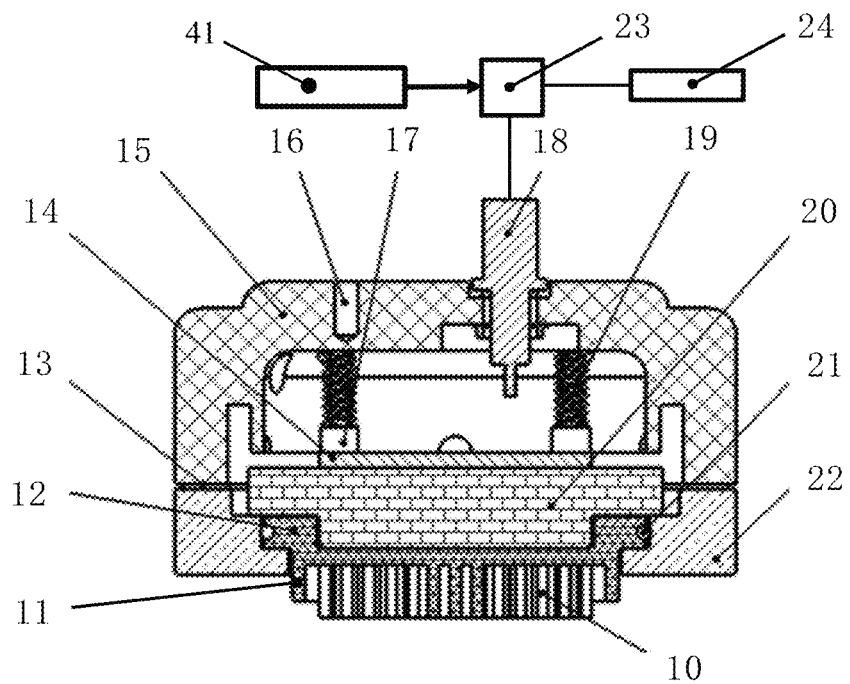
FIG. 28 illustrates a schematic structure of the ultrasonic/megasonic cleaning device according to certain embodiments of the present disclosure.

As shown in FIG. 28, the ultrasonic/megasonic cleaning device may further include a bubble monitor 41 configured to monitor a progressing state of bubble generation and expansion in the cleaning liquid and determine a time length $T_b$ between generation of the bubbles to implosion of the bubbles in the cleaning solution under the effect of the ultrasonic/megasonic wave. The time length $T_b$ measured by the bubble monitor 41 may be used to optimize a frequency-switching timing control of the frequency control unit 23 to switch from a first frequency to a second frequency at a time instance corresponding to a time period shorter than $T_b$. That is, when the cleaning device has operated at the first frequency for the time period $t_s$, a frequency-switching timing control mechanism of the frequency control unit 23 will trigger a frequency change from the first frequency to the second frequency. A range of the time period $t_s$ may be determined according to output $T_b$ of the bubble monitor 41. For example, the time period $t_s$ for triggering frequency switching may be configured to be shorter by an adequate margin than the time length $T_b$ between generation of the bubbles to implosion of the bubbles in the cleaning solution under the effect of the ultrasonic/megasonic wave. In certain embodiments, a time length $T_b$ may be read by the frequency control unit 23 from bubble monitor 41, so that the frequency control unit 23 can determine a suitable range for switching timing according to $T_b$. In certain other embodiments, an operation parameter of the frequency control unit 23 may be configured according to $T_b$, so that the frequency control unit 23 may be configured to switch frequencies at a suitable timing.

Figure 29:
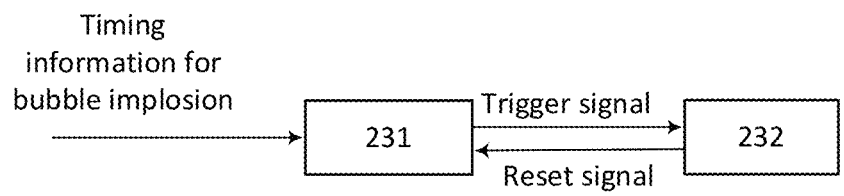
FIG. 29 illustrates a schematic structure of an ultrasonic/megasonic frequency control unit to certain embodiments of the present disclosure.

FIG. 29 illustrates a schematic structure for the frequency control unit 23 according to certain embodiments. As shown in FIG. 29, in certain embodiments, the frequency control unit 23 may include a frequency-switching timing control unit 231 and a frequency-switching control unit 232. The frequency-switching timing control unit 231 may control timing for triggering a frequency-switching operation. Specifically, the frequency-switching timing control unit 231 may send a trigger signal to the frequency-switching control unit 232 after a time period $t_s$. The time period $t_s$ may be selected to ensure that frequency switching takes place before the bubbles in the cleaning solution implode. After the frequency switching is performed by the frequency-switching control unit 232, the frequency-switching control unit 232 may send a reset signal to the frequency-switching timing control unit 231 to re-start a timer in the timing control unit 231 for the next frequency-switching event.

Figure 30:
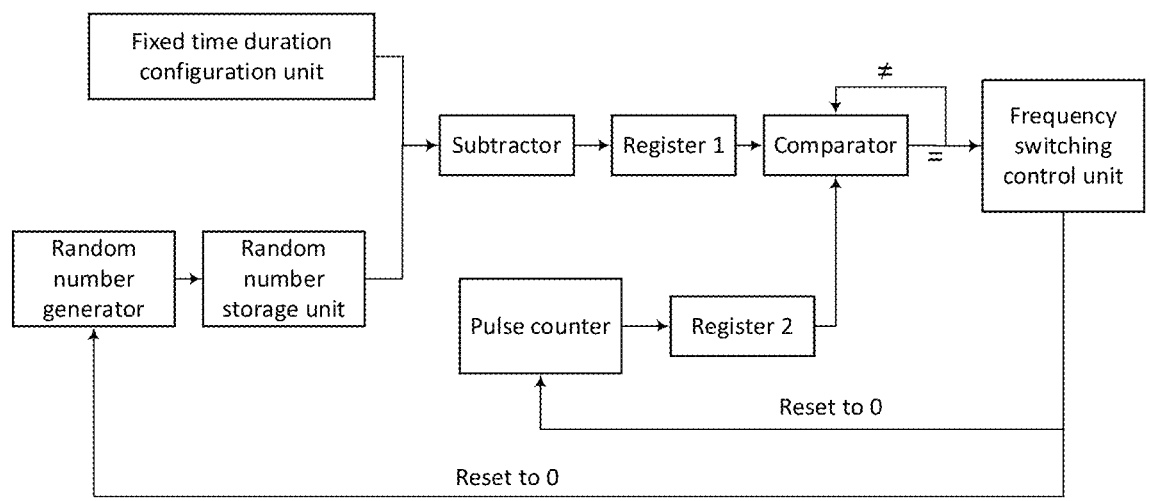
FIG. 30 illustrates a process implemented by a frequency-switching timing control unit.

According to certain embodiments, the frequency-switching timing control may be implemented by a processor executing instructions stored in a memory device. In certain other embodiments, frequency-switching timing control may be implemented by a digital circuit. The processor or the digital circuit may be configured to perform a process illustrated in FIG. 30. The frequency switching timing may be realized by software control and/or a digital logic circuit. When the ultrasonic/megasonic generation and amplification system is turned on, the control system may configure a fixed time duration configuration unit, a random number generator, a random number storage unit, a subtractor, a pulse counter, a first register, a second register, an ultrasonic/megasonic timer unit, a comparator, and so on. For example, generation and shutdown of a commercial ultrasonic/megasonic signal source may reach the micro-second accuracy level. In order to guarantee that frequency switching takes place before bubble implosion, the fixed time duration configuration unit may be configured to a fixed time period below the average bubble implosion time with a margin. For example, the fixed time duration configuration unit may be configured to 90% of the average bubble implosion time. According to process requirements, if the average bubble implosion time is 200 ms, the fixed time duration configuration unit may be configured to 180 ms. A random number corresponding to a time period may be generated by the random number generator, which may be implemented by a computer program. The random number may be stored in the random number storage unit. After the ultrasonic/megasonic source has been turned on, a random number may be generated in every micro-second. The time period corresponding to the generated random number may be within a range of 0-10% of the average time period of bubble implosion. As an example, when the fixed time period is configured to 180 ms, the time period corresponding to the random number may be within the range of 0-20 ms. The random number is generated every micro-second. The storage unit may only need to record the random period received for the first time before each frequency switching is performed. The fixed time period of the fixed time duration configuration unit and the random number storage unit may be inputs to the subtractor. The calculation result from the subtractor is entered to the first register. One of the two inputs to the comparator may be the calculation result of the first register, and the other of the two inputs may be a time period of the ultrasonic/megasonic timer unit, which is recorded in the second register. When the ultrasonic/megasonic system starts up, the frequency switching control module may be activated at the same time. As the process time increases, when the two time periods equal to each other, a frequency switching trigger signal is generated. The comparator may compare the two inputs in real time. If the two inputs are different, no frequency switching is performed. When frequency switching is performed, the frequency switching control unit may generate a reset signal to reset the ultrasonic/megasonic timer unit to restart counting, and the reset signal may also be fed back to the random number generator to generate a new random code to enter the next round of subtraction, comparison, and frequency switching, and thus performing frequency switching cyclically. The frequency switching of the ultrasonic/megasonic system may include frequencies stored in a preconfigured frequency library. For example, three frequencies may be configured in the library to f0, f1, f2. A different frequency may be randomly selected from the library when the frequency switching is triggered.

Figure 31:
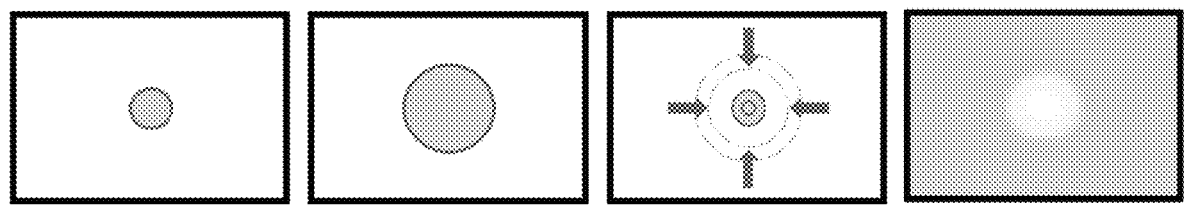
FIG. 31 illustrates an example of the sonoluminescence effect.

The time length between bubble generation to implosion may be determined by the bubble monitor 41. According to certain embodiments, the bubble monitor 41 may be implemented according to principles of sonoluminescence. Bubbles with various sizes may be suspended in the cleaning solution. When bubbles are periodically vibrated by the ultrasonic/megasonic waves, they will grow quickly until rupture and emitting light, a phenomenon known as sonoluminescence phenomenon. FIG. 31 illustrates an example of the sonoluminescence effect. When small bubbles are suspended in a solution, they will be cavitated and grow in the solution when affected by ultrasonic/megasonic vibrations. Sound waves of sufficient intensity may cause bubbles in the liquid to implode within picoseconds under a half cycle of positive pressure. The imploding bubbles will instantly release a large amount of energy and produce short pulse light. The light emitted by the bubbles may last between 35 and hundreds of picoseconds, with a peak intensity of 1-10 MW. These optical signals may be captured by photomultiplier tubes and converted into electrical signals by the circuit for subsequent processing including pulse counting. Therefore, the concentration of bubbles in the solution can be estimated by monitoring the number of pulses generated by the electrical signal in the solution for a certain period of time.

Figure 32:
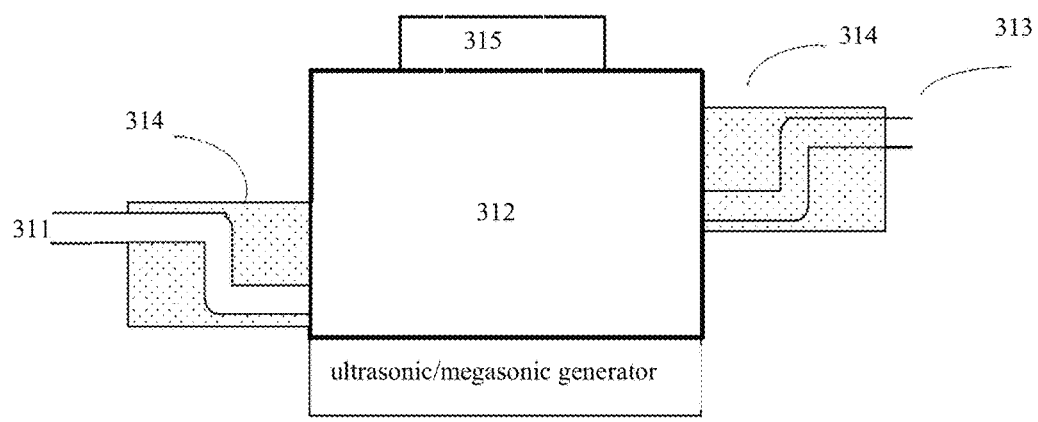
FIG. 32 illustrates a schematic structure of a bubble monitor according to certain embodiments.

According to the above principle, the bubble monitor 41 may be implemented as shown in the FIG. 32. The pipeline 311 on the left side of the figure may be an inlet tube. Cleaning solution on the surface of the wafer may be introduced into an opaque sealed chamber 312 through the liquid inlet tube. After the liquid solution fills the entire chamber, it flows out of the liquid outlet pipe 313 and returns to the surface of the wafer. Two conditions are required when monitoring bubbles based on sonoluminescence. One is that the ultrasonic/megasonic wave must act on the liquid, and the second is that the liquid must be placed in a completely dark environment, which is conducive to the detection of light signals. Therefore, the outside of the chamber 312 may be coated with an opaque coating, and a photomultiplier tube 315 is installed on the top of the chamber 312 to detect the optical signal in the chamber. In order to effectively collect the optical signal in the chamber, there is no opaque coating on the contact part between the sealed chamber and the photomultiplier tube. In order to prevent external light from entering the sealed chamber through the pipelines, the inlet pipeline and the outlet pipeline are designed with a zigzag structure, and part of the pipeline is covered with a completely opaque dark box 314. By the above means, the system may establish a relationship between the bubble generation and imploding and the optical signals, and to indirectly detect the time period from bubble generation to rupture. For different cleaning solutions at different temperatures, the bubble implosion time may be different. Specifically, the bubble monitor may be used to measure bubble implosion time for a cleaning solution at a certain temperature before selecting the timing control settings for the ultrasonic/megasonic frequency switching. To measure average bubble implosion time, collected optical signals may be accumulated over time, and the time interval between the valley and peak of the optical signal may be used to determine the average time of bubble implosion.

Figure 33:
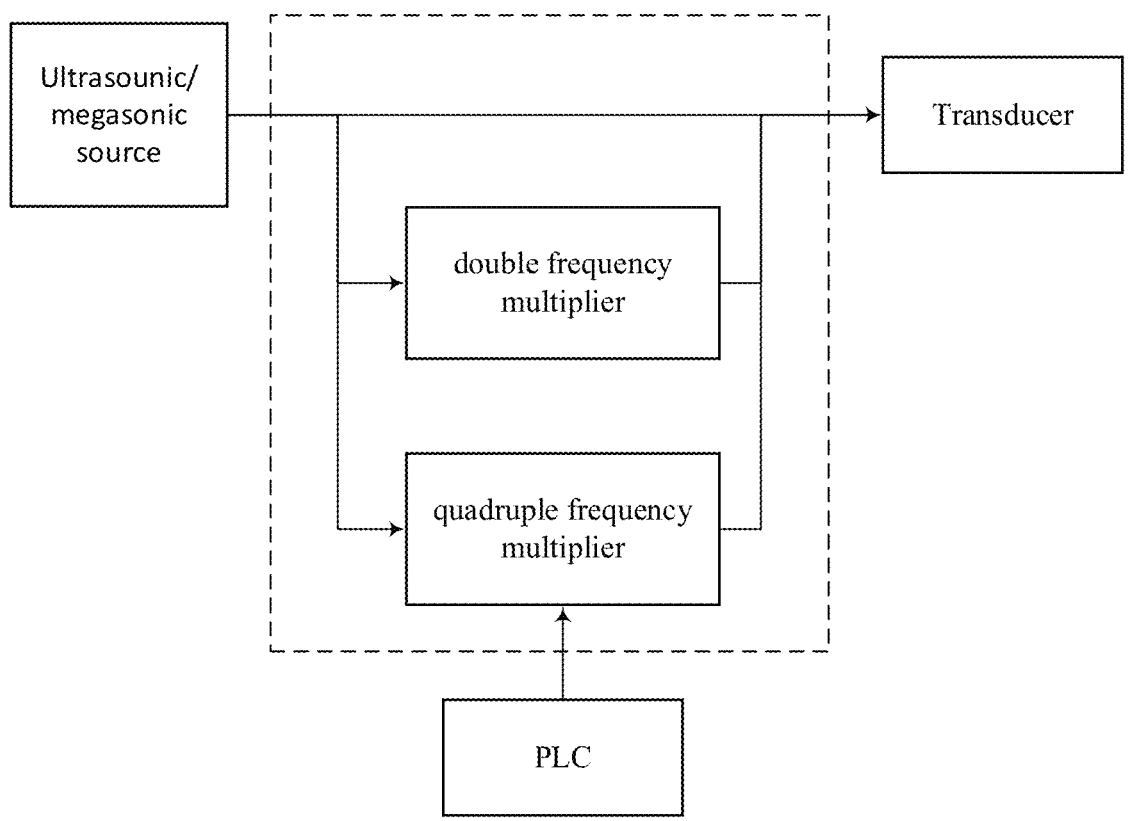
FIG. 33 illustrates a schematic structure of frequency selection unit.

According to certain embodiments, a frequency close to the natural frequency of the piezoelectric material may be selected as the first frequency. A resonance frequency of a bubble may be closely related to the size of the bubble. Bubble implosion may be affected by factors such as the resonance frequency, cleaning solution type, temperature, and pressure. For example, the smaller the size of the bubble, the higher the resonance frequency may be. The bubbles in the cleaning solution gradually grow up after being generated, and the corresponding resonance frequency will become lower and lower. When the resonance frequency changes to the same frequency as the applied ultrasonic/megasonic wave, if the surface tension of the two-phase liquid film is not enough to resist the positive pressure of the ultrasonic/megasonic wave, the bubbles may implode. In order to prevent bubble implosion, the ultrasonic/megasonic frequency should be switched to a frequency value higher than the natural frequency of a certain size bubble before the bubble ruptures. That is, the second frequency may be higher than the first frequency according to certain embodiments. According to certain embodiments, in order to protect the piezoelectric ceramic vibrator of the transducer, the ultrasonic/megasonic frequency may be increased by a programmable logic controller (PLC) frequency converter to an integer n times (such as 2 times, 4 times, etc.) of the first frequency before the bubbles implode, to ensure that the bubble does not implode when the transducer resonates. That is, the second frequency may be configured to be n times of the first frequency, where n is an integer equal or greater than 2. The signal generated by the ultrasonic/megasonic signal source may be directly transmitted to a transducer, or it may be transmitted to the transducer through a double frequency multiplier circuit or a quadruple frequency multiplier. The control selection may be implemented by PLC control, as shown in FIG. 33.

As illustrated in FIGS. 28-33, as well as discussed above, the ultrasonic/megasonic frequency control unit 23 may include a frequency-switching timing control unit 231 configured to trigger an ultrasonic/megasonic frequency-switching control unit 232 to switch the oscillation frequency of the ultrasonic/megasonic wave from a first frequency to a second frequency when the ultrasonic/megasonic wave has been generated at the first frequency for a time period. The time period may be randomly selected within a time range. The time range may be configured by the frequency-switching timing control unit 231 according to an output of the bubble monitor 41. The time range is configured so that the time period for switching is guaranteed to be below a time length between bubbles being generated and growing to a maximum size to implode in the cleaning solution under the effect of the ultrasonic/megasonic wave at the first frequency. Further, since switching timing is randomly selected within the time range instead of being selected at a fixed time interval, no sustained interference is formed. That is, the arrangement of the frequency-switching timing control unit 231 not only guarantees that the ultrasonic/megasonic wave switches frequencies before bubbles are ruptured, but also guarantees that no sustained interferences are formed.

Please referring to FIG. 1, the ultrasonic/megasonic generator and the bottom quartz component 12 are provided within the hollow chamber. A space is formed between the upper portion and the side portion of the ultrasonic/megasonic generator and the inner wall of the hollow chamber, thereby forming a cooling chamber. The ultrasonic/megasonic generator comprises a piezoelectric material 14 which is connected to at least one signal source 24 outside the cleaning unit. The bottom quartz component 12 is attached to the bottom of the ultrasonic/megasonic generator in a close-fitting manner. The bottom quartz component 12 is provided with a quartz rod array 10 at its lower end, which is composed of a plurality of vertically arranged quartz rod-like structures. The quartz rod array 10 extends out from the opening at the bottom surface of the lower casing.

Figure 8:
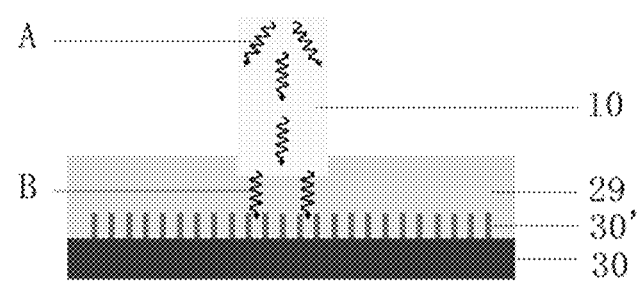
FIG. 8 is a schematic diagram illustrating the principle of the selective removal of the ultrasonic/megasonic energy by the quartz rod array according to one embodiment of the present disclosure.

The ultrasonic/megasonic cleaning device of the present disclosure can also selectively remove part of the ultrasonic/megasonic energy, the working principle of which is illustrated by FIG. 8. As shown in FIG. 1 and FIG. 8, the piezoelectric material 14 generates the ultrasonic/megasonic energy after receiving the electrical signal, which is transmitted downward through the coupling layer 20 to the bottom quartz component 12 and further down to the quartz rod array 10. When the ultrasonic/megasonic energy is propagating in the quartz rod array, the ultrasonic/megasonic energy B (shown in the figure) propagating in a direction perpendicular to the surface of the wafer can smoothly pass the quartz rod array to reach the cleaning solution layer 29 covering the surface of the wafer 30 (the cleaning solution layer 29 is formed by spraying the cleaning solution toward the wafer surface through a cleaning solution nozzle); while the ultrasonic/megasonic energy A (shown in the figure) whose propagation direction is not perpendicular to the wafer surface will be refracted and reflected on the quartz rod-like structures, during which part of the energy is dissipated as heat or other form. Accordingly, the ultrasonic/megasonic energy A which is not perpendicular to the wafer surface will be gradually eliminated after multiple refractions and reflections on the quartz rod array, and only the ultrasonic/megasonic energy B propagating in the direction perpendicular to the wafer surface is retained to reach the cleaning solution on the wafer surface and cause the oscillation of the cleaning solution to remove the contaminants, thereby ensuring the ultrasonic/megasonic energy not to damage the surface pattern structures 30' of the wafer during the ultrasonic/megasonic cleaning process.

Accordingly, the ultrasonic/megasonic energy output from the piezoelectric material of the ultrasonic/megasonic generator is selectively eliminated by the quartz rod array and then reaches the lower ends of the quartz rod-like structures. The lower ends of the quartz rod-like structures are submerged into the cleaning solution covering the surface of the wafer, whereby the ultrasonic/megasonic energy can be vertically conducted to the wafer surface to achieve the ultrasonic/megasonic cleaning.

The wafer cleaning method corresponding to the above-described ultrasonic/megasonic cleaning device comprises the following steps.

Firstly, connecting the ultrasonic/megasonic cleaning device with at least one external signal source. The at least one external signal source includes components like a signal generator, a power amplifier, and an impedance matching device, etc. Next, setting the frequency and power of the electrical signal generated from the external signal source and setting the switching interval of the ultrasonic/megasonic frequency control unit of the ultrasonic/megasonic cleaning device.

Then, setting parameters in the process recipe including the swing path of the spray arm, the flow rate of the cleaning solution, the temperature of the cleaning solution, the position of the cleaning solution pipe, the cleaning time, the flow rate of the cooling gas, and the distance between the bottom of the cleaning unit and the wafer.

After that, performing the cleaning process according to the process recipe. When the piezoelectric material receives the electrical signal with varied frequencies from the ultrasonic/megasonic frequency control unit, it generates high-speed vibration and forms ultrasonic/megasonic energy with varied oscillation frequency, and conducts the ultrasonic/megasonic energy downward into the bottom quartz component via the coupling layer. After propagating through the quartz rod array, only the ultrasonic/megasonic energy traveling perpendicular to the wafer surface is retained, and further down to the cleaning solution layer covering the wafer surface.

At this time, there only exists one vibration energy in the cleaning solution, which is perpendicular to the wafer surface, that is, parallel to the vertical direction of the pattern structures on the wafer surface. This energy causes the oscillation of the cleaning solution, speeds up the peeling and flowing of the contaminants in the pattern structures out of the wafer surface, improves the removal efficiency of the contaminants on the wafer surface and shortens the cleaning process. At the same time, the ultrasonic/megasonic energy that is not perpendicular to the surface of the wafer is eliminated after propagating through the quartz rod array. Therefore, lateral shear force to the wafer surface pattern structures is not generated in the cleaning solution layer. In addition, with the varied oscillation frequency of the ultrasonic/megasonic wave, the permanent interference effect of the ultrasonic/megasonic wave is eliminated and the growth of the cavitation bubbles is effectively controlled. As a result, the pattern structures can be effectively protected, so as to realize the non-destructive ultrasonic cleaning for the wafer.

The ultrasonic/megasonic cleaning described above is achieved by an arc reciprocating motion of the ultrasonic/megasonic cleaning device above the surface of the wafer passing through the center of the wafer, which is driven by the spray arm. Since the linear velocity from the wafer center to the wafer edge gradually increases during the rotation of the wafer, if the ultrasonic/megasonic cleaning device moves at a uniform speed above the wafer surface, the stay time of the ultrasonic/megasonic cleaning device at different locations of the wafer will vary greatly, which may cause the ultrasonic/megasonic energy to change at different locations of the wafer in a way that the ultrasonic/megasonic energy gradually decreases from the center to the edge of the wafer, resulting in a lower removal efficiency of the particulate contaminants at the wafer edge.

Two methods are provided in the prior art to solve this problem. One method is to design the ultrasonic/megasonic cleaning device to be sector-shaped, and the piezoelectric material to have varied area from center to edge to compensate the difference in linear velocity at different positions of the wafer. The second method is to set the trajectory of the spray arm to make it have different speeds at different positions. In the regions where the wafer linear velocity is large, the speed of the spray arm is slow to prolong its stay time, so as to overcome the problem of non-uniform cleaning caused by the linear velocity difference of the wafer.

However, these two methods have their own problems. In the first method, the production requirement for the piezoelectric material is very high. Specifically, for the 300 mm wafers and the forthcoming 450 mm wafers, a sector-shaped piezoelectric material covering the center and edge of the wafer requires integration of multiple smaller piezoelectric materials having exactly the same natural frequency, which greatly increases the production cost and the production complexity of the piezoelectric material. In the second method, since the speed of the spray arm is controlled by the rotating motor, the speed adjustment accuracy is rough, resulting in poor compensation to the difference of the linear velocity at different positions of the wafer. Compared with the prior arts, the present disclosure can further control the distribution of the ultrasonic/megasonic energy to improve the uniformity of the cleaning effect, which will be described in the following specific embodiments.

Figure 9:
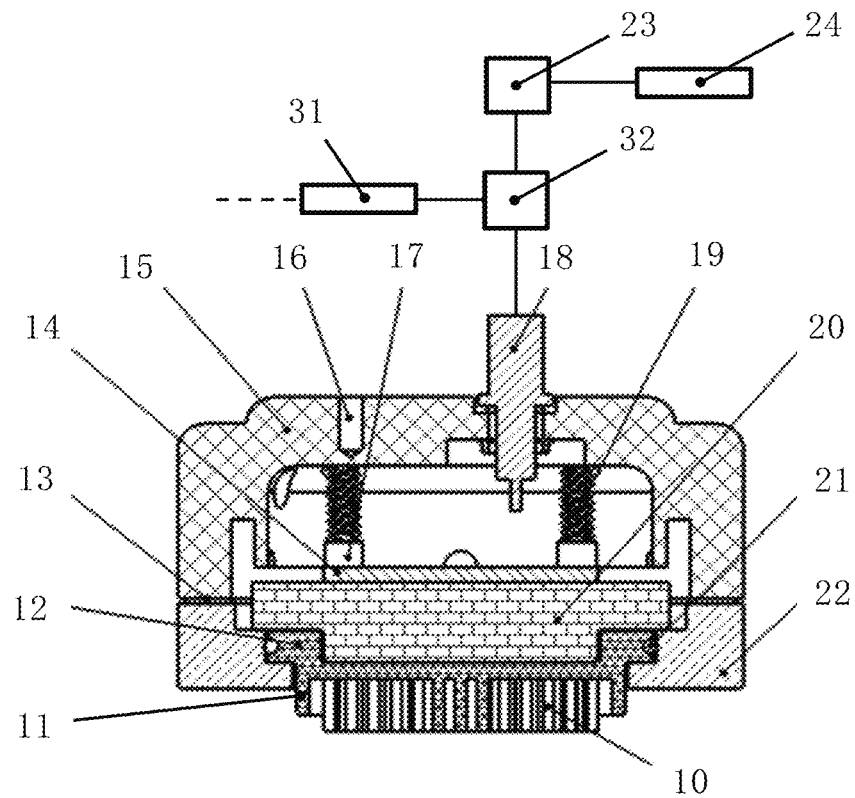
FIG. 9 is a schematic diagram of an ultrasonic/megasonic cleaning device generating evenly distributed energy according to one embodiment of the present disclosure.

FIG. 9 is a schematic diagram of an ultrasonic/megasonic cleaning device which generates evenly distributed energy according to one embodiment of the present disclosure. As shown in FIG. 9, the ultrasonic/megasonic cleaning device of the present disclosure further comprises an ultrasonic/megasonic energy control unit 32 and a real-time position feedback unit 31. The ultrasonic/megasonic energy control unit 32 is connected between the ultrasonic/megasonic frequency control unit 23 and the piezoelectric material 14. For example, the ultrasonic/megasonic energy control unit 32 can be mounted outside the upper casing 15 with one end connected to the ultrasonic/megasonic frequency control unit 23 and the other end connected to the piezoelectric material 14 through a binding post 18. The electrical signal output from the ultrasonic/megasonic frequency control unit 23 is modulated by the ultrasonic/megasonic energy control unit 32 and then introduced to the piezoelectric material 14.

The ultrasonic/megasonic energy control unit 32 is also connected to the real-time position feedback unit 31, and the real-time position feedback unit 31 is connected to the rotating motor (not shown in figure) via a communication wire. The real-time position feedback unit 31 obtains the positional information of the cleaning unit relative to the wafer surface by collecting a unit rotational angle or a unit rotational time of the rotating motor, and transmits the positional information to the ultrasonic/megasonic energy control unit 32. The ultrasonic/megasonic energy control unit 32 modulates the electrical signal from the ultrasonic/megasonic frequency control unit 23 in real time according to the positional information of the cleaning unit from the real-time position feedback unit 31. The modulated electrical signal is converted into mechanical oscillation by the piezoelectric material 14 to finally achieve a uniform distribution of the ultrasonic/megasonic energy throughout the wafer.

Figure 10A:
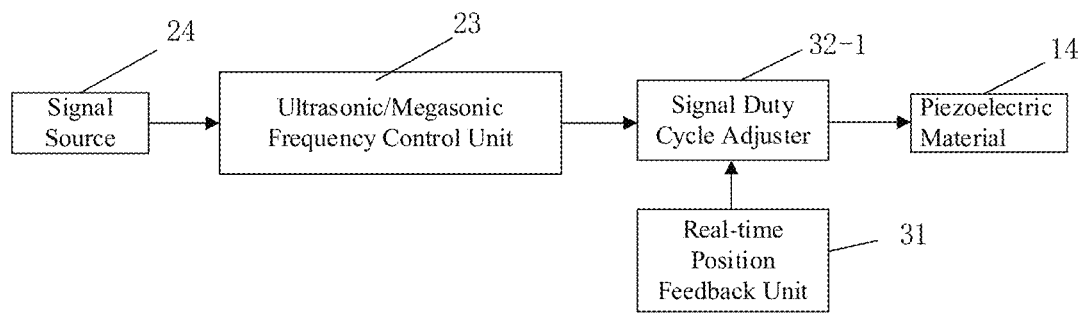
FIGS. 10a-10b are schematic diagrams illustrating two different control principles of the ultrasonic/megasonic energy control unit of the ultrasonic/megasonic cleaning device in FIG. 9.
Figure 10B:
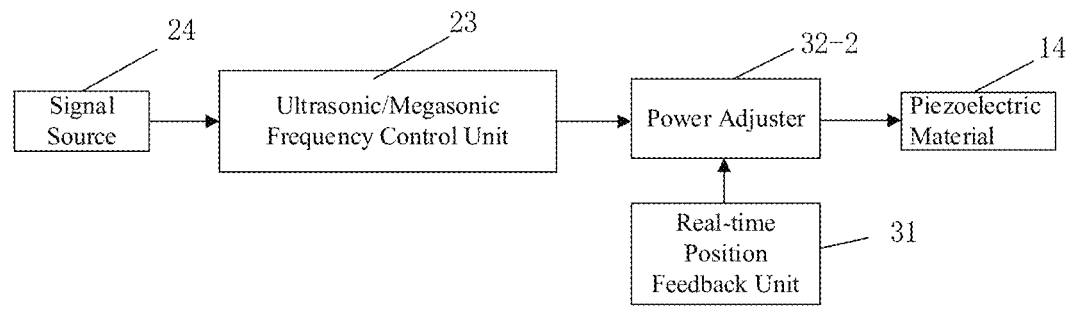

FIGS. 10a-10b are schematic diagrams of two different control principles of the ultrasonic/megasonic energy control unit in FIG. 9. As shown in FIG. 10a, the ultrasonic/megasonic energy control unit comprises a signal duty-cycle adjuster 32-1, having a first end connected to the piezoelectric material 14 through a binding post 18, a second end connected to the ultrasonic/megasonic frequency control unit 23 and a third end connected to the real-time position feedback unit 31.

During the cleaning process, the spray arm drives the movement of the cleaning unit, and the real-time position feedback unit 31 feedbacks the real time position of the cleaning unit above the wafer surface to the signal duty-cycle adjuster 32-1. The signal duty-cycle adjuster 32-1 changes a duty cycle of the electrical signal by increasing time duration of the electrical signal at a low level in accordance with the positional information to make the duty cycle of the electrical signal gradually decrease from the wafer center to the wafer edge, so that the ultrasonic/megasonic wave converted by the piezoelectric material 14 also has a corresponding changed duty cycle.

At the center of the wafer where the linear velocity is small, the duty cycle of the ultrasonic/megasonic wave is large; while at the edge of the wafer where the linear velocity is large, the duty cycle is small. In this way, the same amount of ultrasonic/megasonic pulse signal can be obtained at different positions on the surface of the wafer in per unit time, thus to realize a uniform distribution of the ultrasonic/megasonic energy in the whole wafer range to improve the uniformity of the cleaning.

Referring to FIG. 10b, in another embodiment, the ultrasonic/megasonic energy control unit comprises a power adjuster 32-2, having a first end connected to the piezoelectric material 14 through a binding post 18, a second end connected to the ultrasonic/megasonic frequency control unit 23, and a third end connected to the real-time position feedback unit 31.

During the cleaning process, the spray arm 27 drives the movement of the cleaning unit, and the real-time position feedback unit 31 feedbacks the real time position of the cleaning unit above the wafer surface to the power adjuster 32-2. The power adjuster 32-2 changes the power of the electric signal according to the positional information to make the power of the electrical signal gradually increase from the wafer center to the wafer edge, so that the power of the ultrasonic/megasonic wave converted by the piezoelectric material 14 also changes accordingly.

At the center of the wafer where the linear velocity is small, the power of the ultrasonic/megasonic wave is also small; while at the edge of the wafer where the linear velocity is large, the power is also large. In this way, the same amount of the ultrasonic/megasonic energy can be obtained at different locations on the wafer surface in per unit time, thus to realize a uniform distributed ultrasonic/megasonic energy in the whole wafer rang to improve the uniformity of the cleaning.

The real-time position feedback unit transmits the positional information of the cleaning unit to the ultrasonic/megasonic energy control unit (the signal duty cycle adjuster 32-1 or the power adjuster 32-2) at regular intervals or when the rotating motor rotates a certain angle, the ultrasonic/megasonic energy control unit adjusts the duty cycle or power of the electrical signal according to the real-time positional information of the cleaning unit, thus to obtain the same amount of pulse signal or power of the ultrasonic/megasonic wave at different positions on the wafer surface per unit time to achieve uniformly distributed ultrasonic/megasonic energy throughout the wafer and improve the uniformity of the cleaning.

In addition, the uniformity control of the ultrasonic/megasonic cleaning also relates to the distance between the bottom surface of the cleaning unit and the wafer surface. During the cleaning process, if the bottom surface of the cleaning unit and the wafer surface are not completely parallel, the distance between the two at different locations may be greatly varied, resulting in unevenly distributed ultrasonic/megasonic wave energy. For example, when the cleaning unit of the ultrasonic/megasonic cleaning device is sector-shaped covering a sector-shaped area from the wafer center to the wafer edge, with a smallest vertical distance to the wafer center at the vertex of the sector and a largest vertical distance to the wafer edge at the arc of the sector, the ultrasonic/megasonic wave energy will be distributed unevenly. Therefore, a further improvement to achieve a uniform distribution of ultrasonic/megasonic energy on the entire area of the wafer is provided according to the following embodiments.

Figure 11:
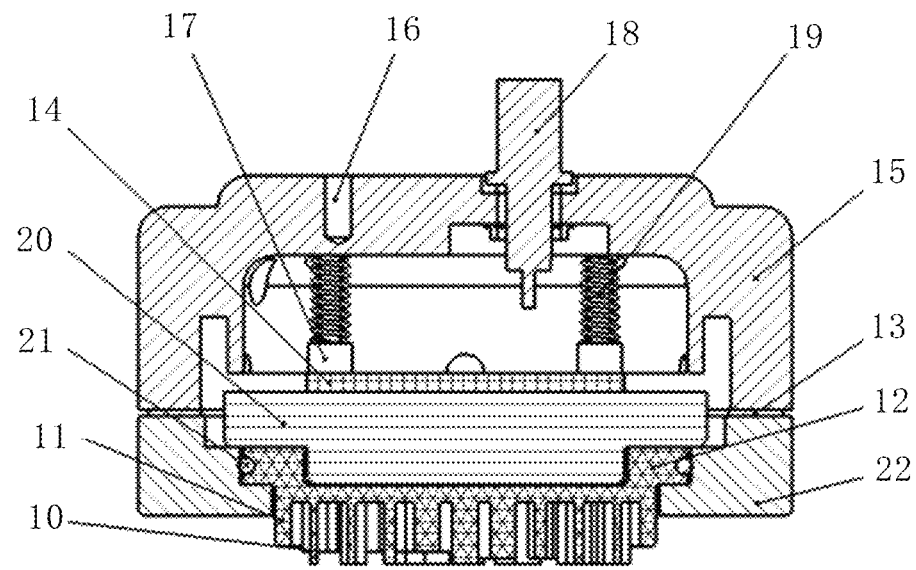
FIG. 11 is a cross-sectional view of an ultrasonic/megasonic cleaning device which can improve the cleaning uniformity according to one embodiment of the present disclosure.
Figure 12:
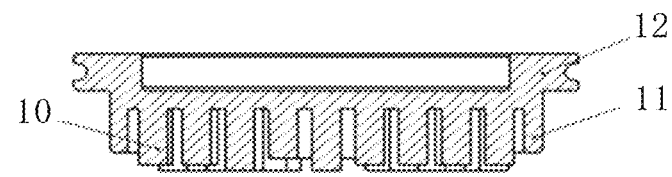
FIG. 12 is a cross-sectional view of the bottom quartz component and structures below the bottom quartz component of the ultrasonic/megasonic cleaning device in FIG. 11.
Figure 13:
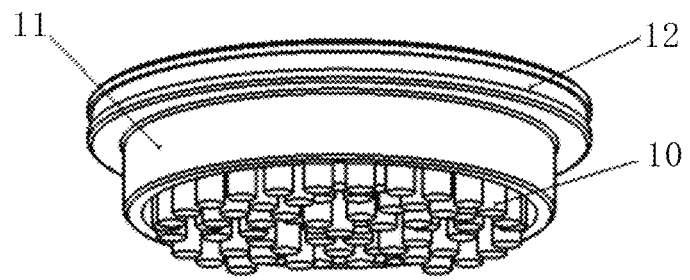
FIG. 13 is schematic perspective view of the bottom quartz component and structures below the bottom quartz component of the ultrasonic/megasonic cleaning device in FIG. 11.

Please refer to FIGS. 11-13. FIG. 11 a cross-sectional view of an ultrasonic/megasonic cleaning device which can improve the cleaning uniformity according to one embodiment of the present disclosure (the related structures other than the cleaning unit are omitted), FIG. 12 is a cross-sectional view of the bottom quartz component in FIG. 11, and FIG. 13 is schematic perspective view of the bottom quartz component in FIG. 11. As shown in FIGS. 11-13, the bottom surfaces of the quartz rod-like structures of the quartz rod array 10 have non-identical heights. For example, the bottom surfaces of the quartz rod-like structures each has a different height; or else, the bottom surfaces of a portion of the quartz rod-like structures have a same minimum height, and the bottom surfaces of the rest of the quartz rod-like structures each has a different height higher than the minimum height.

Figure 14:
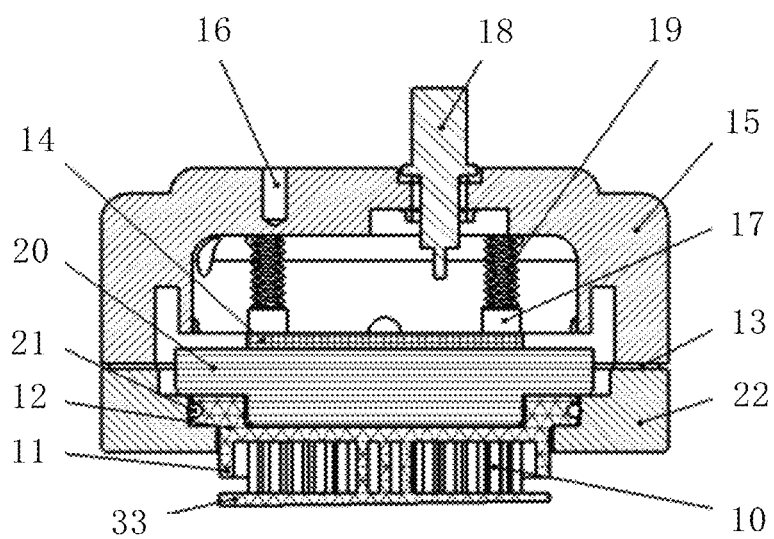
FIG. 14 is a cross-sectional view of an ultrasonic/megasonic cleaning device which can improve the cleaning uniformity according to another embodiment of the present disclosure.

Please refer to FIG. 14. FIG. 14 is a cross-sectional view of an ultrasonic/megasonic cleaning device which can improve the cleaning uniformity according to another embodiment of the present disclosure. As shown in FIG. 14, the bottom surface of the quartz rod array 10 is connected with a bottom quartz sheet 33. The lower surface of the bottom quartz sheet 33 is not higher than the bottom surface of the annular protective ring 11. As shown in the figure, the lower surface of the bottom quartz sheet 33 is lower than the bottom surface of the annular protective ring 11.

Figure 15:
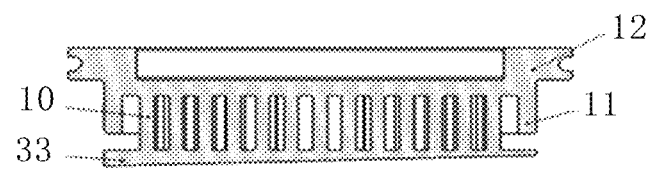
FIG. 15 is a cross-sectional view of the bottom quartz component and structures below the bottom quartz component of the ultrasonic/megasonic cleaning device in FIG. 14.

Please refer to FIG. 15. FIG. 15 is a cross-sectional view of the bottom quartz component in FIG. 14. The upper surface of the bottom quartz sheet 33 is a horizontal surface connected with the bottom surface of each quartz rod-like structure, while the lower surface of the bottom quartz sheet 33 is a non-horizontal surface like a sloping surface, as shown in the figure. When the bottom quartz sheet 33 is lower than the bottom surface of the annular protective ring 11, its area and horizontal position can be the same as the area and horizontal position of the region enclosed by the annular protective ring 11. It is noted that necessary gaps should be kept between the bottom quartz sheet 33 and the bottom surface of the annular protective ring 11, in order to facilitate the smooth flow of the cleaning solution.

The bottom quartz sheet 33 also serves to protect the quartz rod array 10 during the installation and commissioning processes of the bottom quartz component 12 and its underlying structures, so as to prevent inadvertent damages to the fine quartz rod-like structures.

Figure 16A:
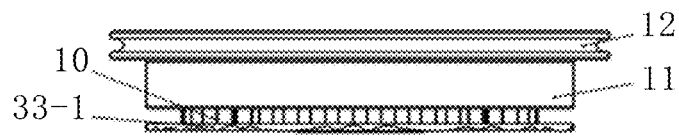
FIGS. 16a-16c are enlarged schematic views illustrating different configurations of the bottom quartz sheet of the ultrasonic/megasonic cleaning device in FIG. 14.
Figure 16B:
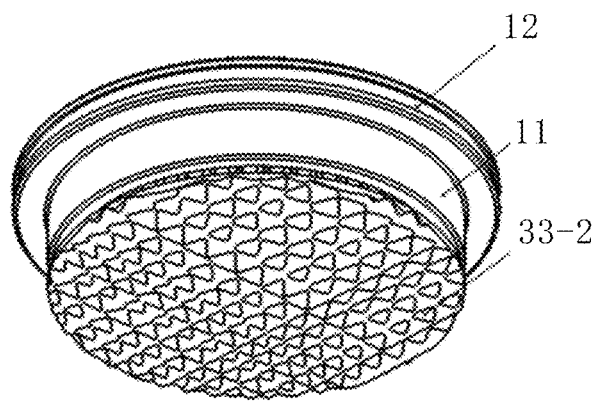
Figure 16C:
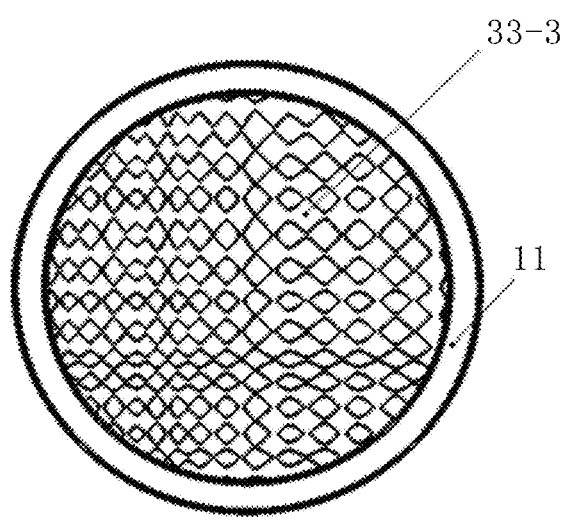

Then, please refer to FIGS. 16a-16c. FIGS. 16a-16c are enlarged schematic views of different configurations of the bottom quartz sheet in FIG. 14. As shown in FIGS. 16a-16c, the bottom quartz sheet 33 has other non-horizontal lower surface structures. For example, as shown in FIG. 16a, the bottom quartz sheet 33-1 adopts a wavy niche-like lower surface structure; as shown in FIG. 16b, the bottom quartz sheet 33-2 adopts a rugged lower surface structure having numerous approximate triangular patterns; as shown in FIG. 16c, the bottom quartz sheet 33-3 adopts a rugged lower surface structure having a plurality of unevenly distributed approximate rhombus patterns with different sizes.

The bottom quartz sheet may also have other non-horizontal lower surface structures, which is not detailed herein.

During the ultrasonic/megasonic cleaning process, the ultrasonic/megasonic energy propagating in the direction perpendicular to the wafer surface can be conducted vertically to the wafer surface through the lower end of the quartz rod-like structures or the bottom quartz sheet submerged in the cleaning solution, to remove the contaminants on the wafer surface. At the same time, with the rotation of the wafer, the distance between the bottom surface of the cleaning unit and the wafer surface can be changed in real time by the quartz rod-like structures having the bottom surfaces at different heights or the bottom quartz sheet having the non-horizontal lower surface structure. Due to the dynamically changed distance between the bottom surface of the cleaning unit and the wafer surface, each position on the wafer surface will receive the ultrasonic/megasonic energy transmitted through different distances, so that the ultrasonic/megasonic energy can be evenly distributed throughout the wafer surface, and all the regions of the entire wafer can be uniformly and non-destructively cleaned.

Figure 17:
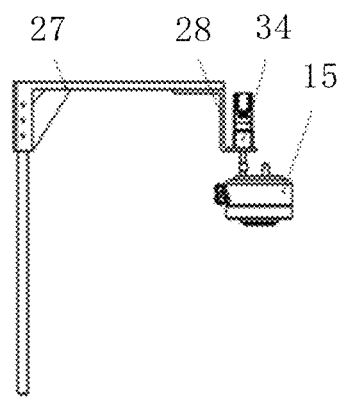
FIG. 17 is a schematic view illustrating another fitting state of the cleaning unit and the spray arm according to one embodiment of the present disclosure.
Figure 18:
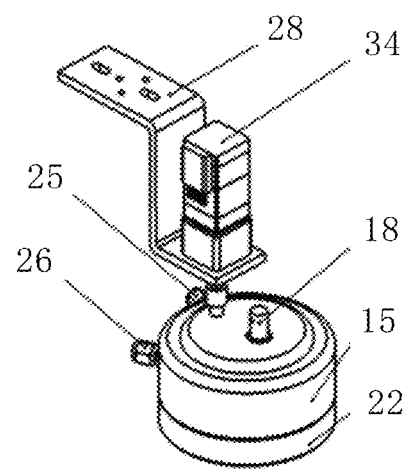
FIG. 18 is a partial enlarged schematic view of the cleaning unit and the spray arm in FIG. 17.

Please refer to FIG. 17 and FIG. 18. FIG. 17 is a schematic view showing another fitting state of the cleaning unit and the spray arm of the present disclosure, and FIG. 18 is a partially enlarged schematic view of FIG. 17. As shown in FIGS. 17 and 18, in order to solve the above-mentioned problem of non-uniform distribution of ultrasonic/megasonic energy, another solution is to mount a rotary motor 34 on the top of the upper casing 15 of the cleaning unit. Specifically, a rotary shaft of the rotary motor 34 is connected with the upper casing 15, and the rotary motor 34 is connected to the spray arm 27 via the fixing support 28. During the cleaning process, the rotary motor 34 drives the entire cleaning unit (casing) to rotate in a horizontal plane above the wafer surface. The rotary shaft of the rotary motor may also be eccentrically connected to the top of the upper casing to increase the rotational (oscillation) amplitude of the cleaning unit. Furthermore, the lower end of the quartz rod array (the lower ends of the quartz rod-like structures) may have non-identical heights, or the bottom quartz sheet may have a non-horizontal lower surface structure. In such cases, with the rotational movement of the cleaning unit itself, the distance between the bottom surface of the cleaning unit and the wafer surface can be dynamically changed. After a certain cleaning time period, the ultrasonic/megasonic energy is uniformly distributed on the entire wafer.

The current single-wafer cleaning equipment cleans the wafer by rotating the wafer and simultaneously spraying cleaning solution to the high-speed rotational wafer surface. During such cleaning process, the wafer is held by a plurality of clamping elements mounted on a circular chuck body and is rotated along with the chuck body. At the same time, the cleaning solution is sprayed out to the wafer from a spray arm of the cleaning equipment.

During the cleaning process using chemical solutions and ultrapure water, materials of the wafer surface are prone to be damaged or reacted with the solutions. For example, during a DHF cleaning process, firstly a DHF solution is injected on the wafer surface through a spray arm to completely remove the native oxide layer formed on the wafer surface. Then ultra-pure water is injected to wash the wafer surface to remove the residual DHF solution and the reaction products. Finally, a nitrogen gas is injected to dry the wafer surface to complete the whole cleaning process. However, during the above process, bare silicon on the wafer surface is easy to react with the oxygen in the cleaning chamber to generate silicon dioxide, which changes the materials on the wafer surface and affects the subsequent processes. Accordingly, the oxygen content in the cleaning chamber should be controlled during the cleaning process.

On the other hand, during the above nitrogen gas drying process, watermark defects may appear on the wafer surface if the process condition is not properly controlled. The main mechanism of the watermark formation is that, the residual water formed on the wafer surface due to incomplete drying during the nitrogen gas drying process dissolves the silicon dioxide reacted from oxygen and the silicon element on the wafer surface to further generate H2SiO3 or HSiO3-deposition, thereby creating a flat watermark after the evaporation of the water. Furthermore, during the above cleaning process, water droplets often appear on the wafer edge due to incomplete drying, which also affects the wafer cleaning quality. Therefore, the optimization of the drying process is required to achieve a complete drying for the entire wafer surface.

The present disclosure further provides a gas shielding function during the above-mentioned non-destructive wafer cleaning process. In the cleaning process, a shielding gas like nitrogen, argon or other inert gas forms a gas shielding layer above the wafer, which on one hand isolates the wafer from the oxygen and prevents oxidization of the silicon material on the wafer surface, on the other hand covers the whole wafer to achieve better drying effect with the high-speed rotation of the wafer, prevent the watermark defects and improve the cleaning effect especially at the wafer edge.

The gas shielding function can be implemented in two different ways.

Figure 19:
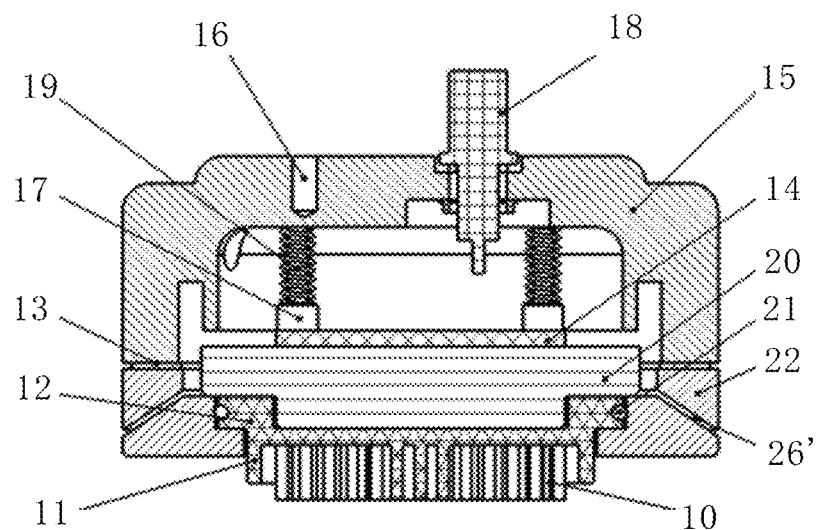
FIG. 19 is a cross-sectional view of an ultrasonic/megasonic cleaning device with gas shielding function according to one embodiment of the present disclosure.
Figure 20:
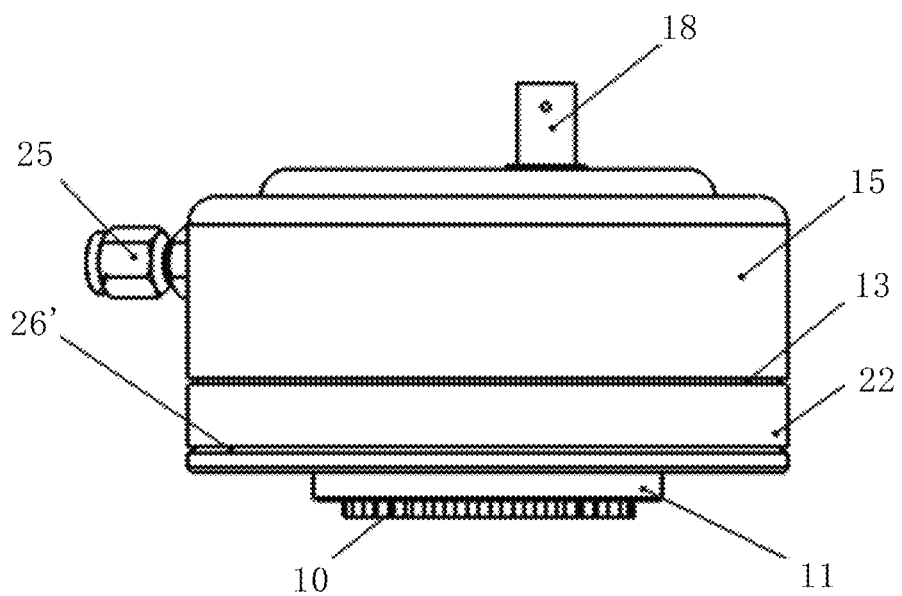
FIG. 20 is a schematic view showing the external configuration of the ultrasonic/megasonic cleaning device in FIG. 19.

Please refer to FIGS. 19 and 20. FIG. 19 is a cross-sectional view of an ultrasonic/megasonic cleaning device with gas shielding function according to one embodiment of the present disclosure, and FIG. 20 is a schematic view showing the external configuration of the ultrasonic/megasonic cleaning device in FIG. 19. As shown in FIGS. 19 and 20, the cooling gas flowing in the cleaning device itself in the above-described embodiments is used as the shielding gas. In the cleaning unit, a cooling gas inlet 25 is formed on the upper casing 15, serving as a common inlet for the cooling gas and the shielding gas; and an annular air gap or a circle of gas holes inclined downward are formed at the sidewall of the lower casing 22 near its bottom surface, serving as a common outlet 26' for the cooling gas and the shielding gas. The cooling gas enters to the inside of the cleaning unit from the gas inlet 25, that is, the cooling chamber formed by the inner wall of the hollow chamber and the outer wall of the ultrasonic/megasonic generator, cools the piezoelectric material and the coupling layer, and finally discharges from the annular opening 26' to form a gas shielding layer on the wafer surface to control the oxygen content in the cleaning chamber during the cleaning process and prevent the reaction between the wafer and the oxygen in the air. In the drying process, the cleaning unit also sprays out the cooling gas as the shielding gas to dry the wafer surface to replace the conventional single spray arm that injects a drying gas individually, which simplifies the component structures inside the cleaning chamber. During the drying process, the cleaning unit with the gas shielding function can be fixed above the wafer center to statically spray out the shielding gas; or the cleaning unit can perform an arc-shaped reciprocating motion above the wafer surface driven by the spray arm while spraying out the shielding gas.

Figure 21:
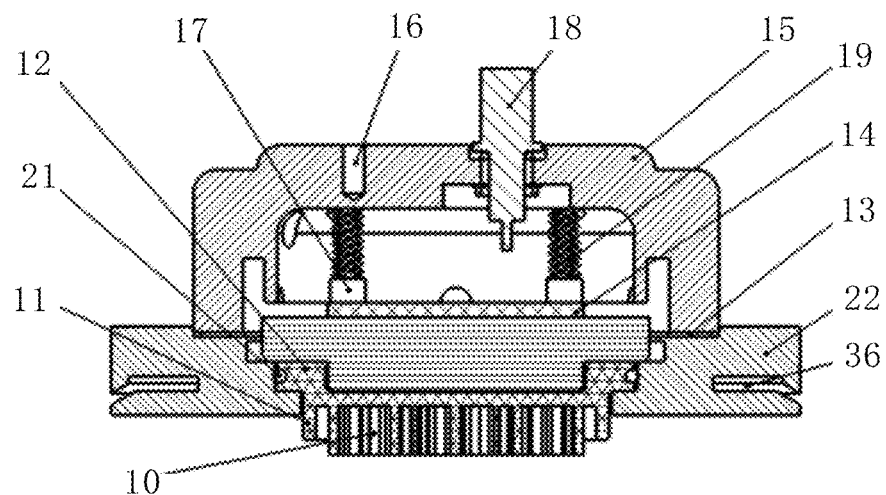
FIG. 21 is a cross-sectional view of an ultrasonic/megasonic cleaning device with gas shielding function according to another embodiment of the present disclosure.
Figure 22:
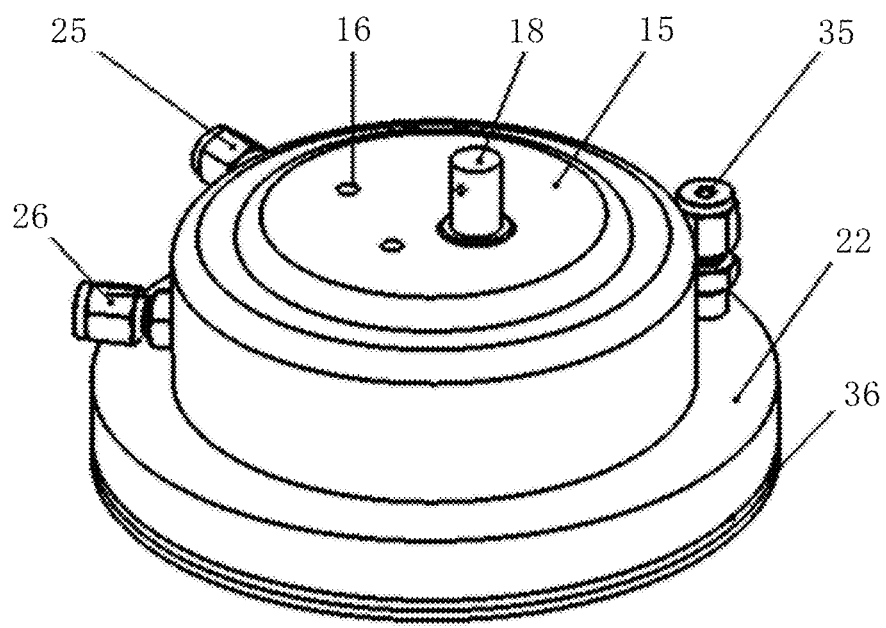
FIG. 22 is a schematic view illustrating the external configuration of the ultrasonic/megasonic cleaning device in FIG. 21.

Please refer to FIGS. 21 and 22. FIG. 21 is a cross-sectional view of an ultrasonic/megasonic cleaning device with gas shielding function according to another embodiment of the present disclosure. FIG. 22 is a schematic view showing the external configuration of the ultrasonic/megasonic cleaning device in FIG. 21. As shown in FIGS. 21 and 22, the cleaning unit uses an individual shielding gas inlet 35 formed on the upper casing to introduce a shielding gas. Likewise, an annular air gap or a circle of gas holes inclined downward are formed at the sidewall near the bottom surface of the lower casing to serve as an individual shielding gas outlet 36. The shielding gas is introduced into the shielding gas inlet 35 and discharged from the shielding gas outlet 36 to form a gas shielding layer above the wafer surface, so as to control the oxygen content in the cleaning chamber and achieve a better drying effect for the entire wafer surface during the drying process.

In addition, when protecting the quartz rod-like structures of the quartz rod array 10, the annular protective ring should also allow the cleaning solution flowing freely and filling the space between the quartz rod array and the wafer surface, so that the ultrasonic/megasonic energy can be effectively conducted to the cleaning solution layer on the wafer surface.

When the height of the annular protective ring is consistent with the height of the quartz rod array, since the cleaning unit is at a certain distance from the wafer surface during cleaning, the cleaning solution can enter into the space between the quartz rod array and the wafer surface. However, due to the surface tension of liquid, the replacement effect of the cleaning solution will be relatively poor, which affects the exchange between the new and the existing cleaning solution, and results in unsatisfied cleaning effect.

Multiple optimizations can be designed to overcome the above deficiencies. For example, as shown in FIG. 3, the bottom surface of the annular protective ring 11 may be slightly higher than the bottom surface of the quartz rod array 10 to facilitate the cleaning solution to enter and exit the space between the quartz rod array and wafer surface. However, in this optimization scheme, since the bottom surface of the quartz rod array is lower than the bottom surface of the annular protective ring, the protection effect of the quartz rod array is rather poor.

Figure 23:
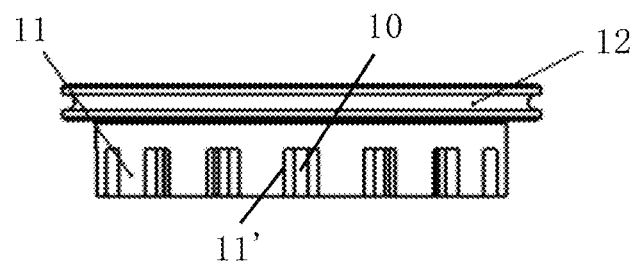
FIG. 23 is a schematic structural view of the annular protective ring provided with an opening according to one embodiment of the present disclosure.

Therefore, it is possible to further optimize the structure of the annular protective ring in a way to keep the height of the annular protective ring equal to the height of the quartz rod array. In another embodiment, the annular protective ring has the same height as the quartz rod array, meanwhile openings with a specific shape are formed on the sidewall of the annular protective ring, so as to enable a free flow of the cleaning solution in the space between the quartz rod array and the wafer surface, eliminate the surface tension of the cleaning solution on the wafer surface, improve the replacement effect of the cleaning solution, speed up the exchange process of the new and the existing cleaning solution, and finally improve the cleaning effect. As shown in FIG. 23, in one embodiment, rectangular openings 11' are formed on the sidewall of the annular protective ring 11. In other embodiments, the rectangular openings can be replaced by arch-shaped openings, or openings in other forms, such as door-like or window-like openings.

Figure 24:
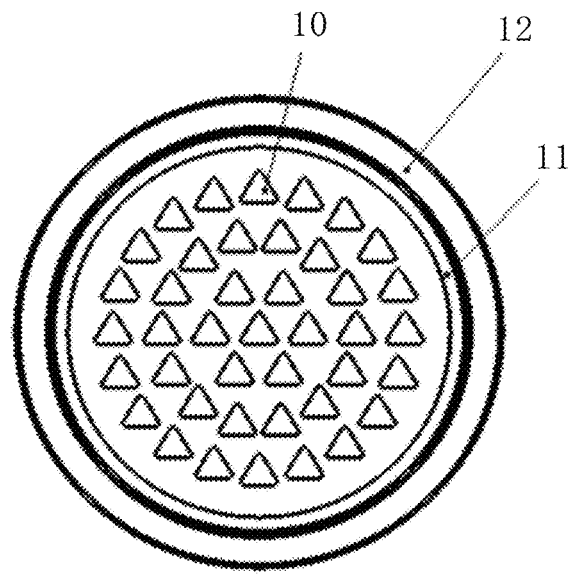
FIG. 24 is a schematic diagram illustrating regularly distributed triangular quartz rod-like structures according to one embodiment of the present disclosure.
Figure 25:
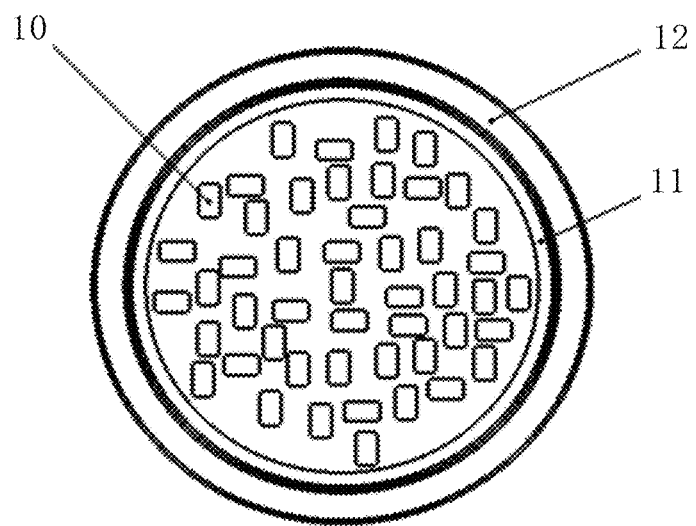
FIG. 25 is a schematic diagram illustrating randomly distributed rectangular quartz rod-like structures according to one embodiment of the present disclosure.

As a further optimization, the quartz rod-like structures in the quartz rod array are solid rods each having a circular shape or other shapes such as triangle, pentagon, rectangle, etc. In addition, the quartz rod-like structures can be distributed according to a certain rule or completely randomly, as long as to prevent intense energy forming at specific regions during the movement of the cleaning unit and achieve a uniform distribution of the ultrasonic/megasonic energy. For example, as shown in FIG. 24, the quartz rod array 10 comprises regularly distributed triangular quartz rod-like structures according to one embodiment of the present disclosure. As shown in FIG. 25, the quartz rod array 10 comprises randomly distributed rectangular quartz rod-like structures according to another embodiment of the present disclosure.

Figure 26:
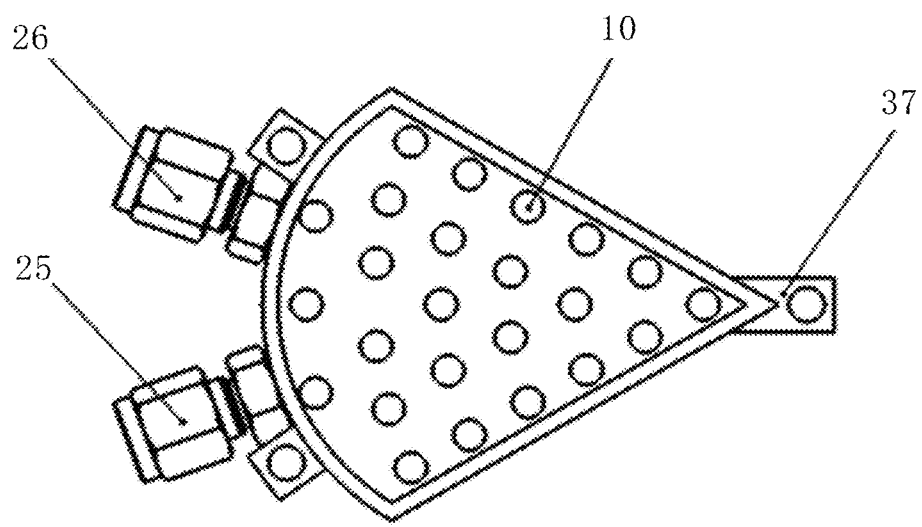
FIG. 26 is a schematic diagram of a quartz rod array having a sector-shaped profile according to one embodiment of the present disclosure.
Figure 27:
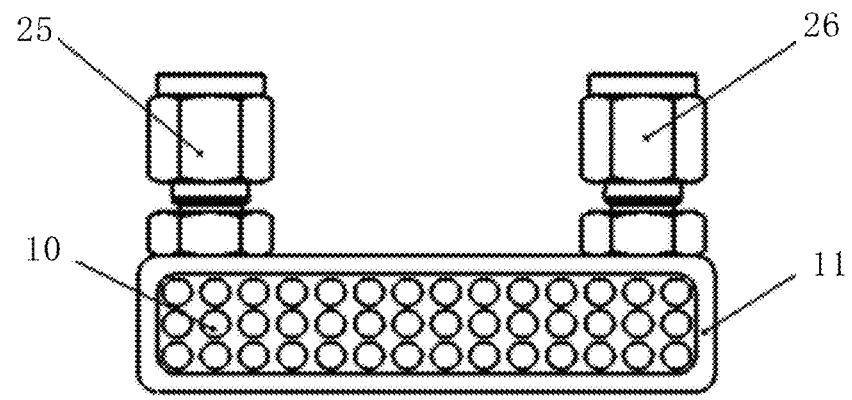
FIG. 27 is a schematic diagram of a quartz rod array having a rectangular profile according to one embodiment of the present disclosure.

As another improvement, in order to increase the cleaning efficiency of the cleaning device, the shape of the cleaning unit can be optimized. In other words, the overall profile of the casing which encloses the ultrasonic/megasonic generator and the bottom quartz component is optimized to enlarge the coverage area of the cleaning unit, thereby improving the cleaning efficiency of the cleaning device. For example, the horizontal profile of the casing can be designed to be sector-shaped, triangular, pentagonal, rectangular, or square, such that the profiles of the bottom surfaces of the ultrasonic/megasonic generator and the bottom quartz component are in the shape of a sector, a triangle, a pentagon, a rectangle, or a square. Furthermore, the profiles of the bottom surfaces of the piezoelectric material, the coupling layer, the annular protective ring and the quartz rod array are all in the shape of a sector, a triangle, a pentagon, a rectangle, or a square. For example, as shown in FIG. 26, which is a schematic diagram of an ultrasonic/megasonic cleaning device having a sector-shaped profile according to one embodiment of the present disclosure, the cleaning device has a sector-shaped piezoelectric material and coupling layer, as well as a sector-shaped annular protective ring and quartz rod array. The upper casing and the lower casing are assembled through fixing holes 37 formed in the upper casing and the lower casing. The cleaning device covers a sector-shaped area from the wafer center to the wafer edge to ensure that the wafer surface covered by the cleaning device can be cleaned simultaneously, in order to improve the cleaning efficiency and uniformity. As shown in FIG. 27, which is a schematic diagram of an ultrasonic/megasonic cleaning device having a rectangular-shaped profile according to another embodiment of the present disclosure, the cleaning device has a rectangular-shaped piezoelectric material and coupling layer, rectangular-shaped annular protective ring and quartz rod array, which covers a rectangular area of the wafer from the wafer center to the wafer edge.

While this invention has been particularly shown and described with references to preferred embodiments thereof, if will be understood by those skilled in the art that various changes in form and details may be made herein without departing from the spirit and scope of the invention as defined by the appended claims.

What is claimed is:

1. An ultrasonic/megasonic cleaning device, comprising:
a cleaning unit comprising:
an upper casing and a lower casing, the upper casing and the lower casing being connected to form a hollow chamber, the hollow chamber being provided with an opening at a bottom surface of the lower casing;
an ultrasonic/megasonic generator provided in the hollow chamber with a space formed between an upper portion and side portion of the ultrasonic/megasonic generator and an inner wall of the hollow chamber; the ultrasonic/megasonic generator including a piezoelectric material connected to at least one signal source outside the cleaning unit, for receiving an electrical signal outputted from the at least one signal source and generating an ultrasonic/megasonic wave having an oscillation frequency; and
a bottom quartz component provided with a quartz rod array composed of a plurality of vertically arranged quartz rod-like structures; wherein, the quartz rod array extends out from the opening at the bottom surface of the lower casing for conducting the ultrasonic/megasonic wave vertically downward to a cleaning solution on a surface of a wafer;

a spray arm connected to the upper casing; wherein, the spray arm is driven by a rotary motor to enable the cleaning unit to perform an arc reciprocating motion above the surface of the wafer passing through a center of the wafer; and an ultrasonic/megasonic frequency controller connected between the at least one signal source and the ultrasonic/megasonic generator, for varying a frequency of the electrical signal outputted from the at least one signal source and introducing the electrical signal having a varied frequency into the ultrasonic/megasonic generator, so as to dynamically vary the oscillation frequency of the ultrasonic/megasonic wave generated by the ultrasonic/megasonic generator;

wherein:
for varying the oscillation frequency of the ultrasonic/megasonic wave, the ultrasonic/megasonic frequency controller includes a frequency-switching timing controller configured to trigger an ultrasonic/megasonic frequency-switching controller to switch the oscillation frequency of the ultrasonic/megasonic wave from a first frequency to a second frequency when the ultrasonic/megasonic wave has been generated at the first frequency for a time period, the time period being randomly selected within a time range.

2. The ultrasonic/megasonic cleaning device according to claim 1, wherein the amount of the at least one signal source is one; the ultrasonic/megasonic frequency controller includes a frequency converter connected between the piezoelectric material and the signal source; the frequency converter changes a frequency of the electrical signal output from the signal source near a natural frequency of the piezoelectric material positively and negatively to output multiple electrical signals with different frequencies.

3. The ultrasonic/megasonic cleaning device according to claim 1, wherein the amount of the at least one signal sources is one; the piezoelectric material comprises multiple sub-materials with different natural frequencies connected to the signal source; the ultrasonic/megasonic frequency controller includes a frequency converter and a channel selector provided in sequence between the signal source and the sub-materials; the frequency converter changes a frequency of the electrical signal from the signal source and outputs several electrical signals with different frequencies which are respectively corresponding to the natural frequencies of the sub-materials; the channel selector switches on a communication channel to the sub-material whose natural frequency is the same as the frequency of electrical signal output from the frequency converter, so as to dynamically change the oscillation frequency of the ultrasonic/megasonic wave generated by the ultrasonic/megasonic generator.

4. The ultrasonic/megasonic cleaning device according to claim 1, further comprising:
an ultrasonic/megasonic energy controller including a signal duty-cycle adjuster which is connected with the ultrasonic/megasonic frequency controller and the piezoelectric material; the signal duty-cycle adjuster changes a duty cycle of an electrical signal output from the ultrasonic/megasonic frequency controller in accordance with positional information of the cleaning unit relative to the wafer surface to make the duty cycle of the electrical signal gradually decrease from the wafer center to a wafer edge, so that the ultrasonic/megasonic wave converted by the piezoelectric material has a corresponding changed duty cycle to obtain a same amount of ultrasonic/megasonic pulse signal at different positions on the wafer surface in per unit time.

5. The ultrasonic/megasonic cleaning device according to claim 1, further comprising:
an ultrasonic/megasonic energy controller including a power adjuster connected with the ultrasonic/megasonic frequency controller and the piezoelectric material; the power adjuster changes power of an electrical signal output from the ultrasonic/megasonic frequency controller according to positional information of the cleaning unit relative to the wafer surface to make the power of the electrical signal gradually increase from the wafer center to a wafer edge, so that the power of the ultrasonic/megasonic wave converted by the piezoelectric material changes accordingly to obtain a same amount of ultrasonic/megasonic energy at different positions on the wafer surface in per unit time.

6. The ultrasonic/megasonic cleaning device according to claim 1, wherein bottom surfaces of the quartz rod-like structures of the quartz rod array have non-identical heights.

7. The ultrasonic/megasonic cleaning device according to claim 1, wherein a bottom surface of the quartz rod array is connected with a bottom quartz sheet; the bottom quartz sheet has a non-horizontal lower surface structure.

8. The ultrasonic/megasonic cleaning device according to claim 1, wherein the spray arm is connected to a top of the upper casing through a rotary shaft of the rotary motor for controlling a horizontal rotation of the cleaning unit.

9. The ultrasonic/megasonic cleaning device according to claim 1, further comprising a shielding gas inlet formed on the upper casing and a shielding gas outlet formed at a side portion of the lower casing; wherein the shielding gas outlet is an annular gap or a circle of gas holes inclined downward.

10. The ultrasonic/megasonic cleaning device according to claim 1, further comprising a gas inlet formed in the upper casing and a gas outlet formed at a side portion of the lower casing; wherein the gas outlet is an annular gap or a circle of gas holes inclined downward; the gas inlet and the gas outlet communicate a cooling chamber composed of an inner wall of the hollow chamber and an outer wall of the ultrasonic/megasonic generator.

11. The ultrasonic/megasonic cleaning device according to claim 1, wherein the bottom quartz component is further provided with an annular protective ring enclosing the quartz rod array; wherein the annular protective ring has a side portion sealed with an inner wall of the lower casing and a lower end extending out from the opening at the bottom surface of the lower casing; the ultrasonic/megasonic generator includes a coupling layer which is in contact with the piezoelectric material from above and in contact with the bottom quartz component from below; the piezoelectric material, the coupling layer and the bottom quartz component are pressed by compression springs and compression spring guideposts sequentially provided between a top of the upper casing and the piezoelectric material; the upper casing is provided with a piezoelectric material binding post; the electrical signal output from the ultrasonic/megasonic frequency controller is introduced to the piezoelectric material through the piezoelectric material binding post to generate the ultrasonic/megasonic wave with oscillation energy.

12. The ultrasonic/megasonic cleaning device according to claim 1, wherein the time period is below a time length between bubbles being generated and growing to a maximum size to implode in a cleaning solution under the effect of the ultrasonic/megasonic wave at the first frequency.

13. The ultrasonic/megasonic cleaning device according to claim 12, wherein:
the frequency-switching timing controller includes a random number generator, a random number storage unit, a subtractor, a pulse counter, a first register, a second register, and a comparator;
the random number generator is configured to generate a random number periodically after an ultrasonic/megasonic source has been turned on;
the random number corresponds a random time length within a range of 0-10% of average bubble implosion time;
the random number storage unit is configured to store the random number for a first time before each frequency switching is performed;
the subtractor is configured to subtract the random number stored in the random number storage unit from a fixed time period below an average bubble implosion time with a margin;
the first register is configured to record a calculation result from the subtractor;
the second register is configured to record a second time period;
the comparator is configured to compare the calculation result recorded in the first register with the second time period recorded in the second register, and generate a frequency switching trigger signal when the calculation result equals to the second time period; and
when frequency switching is performed, the ultrasonic/megasonic frequency: switching controller is configured to generate a reset signal to restart counting, and the reset signal is fed back to the random number generator to generate a new random number to enter a next round of subtraction, comparison, and frequency switching, and thus performing frequency switching cyclically.

14. The ultrasonic/megasonic cleaning device according to claim 13, further comprising a bubble monitor configured to determine the time length between bubbles being generated and growing to a maximum size to implode in the cleaning solution under the effect of the ultrasonic/megasonic wave at the first frequency.

15. The ultrasonic/megasonic cleaning device according to claim 14, wherein the bubble monitor is configured to measure an optical signal caused by sonoluminescence of bubble implosion, and evaluate the time length according to the optical signal.

16. The ultrasonic/megasonic cleaning device according to claim 14, wherein the bubble monitor includes:
an opaque sealed chamber filled with the cleaning solution, wherein the ultrasonic/megasonic wave is applied to the cleaning solution;
an inlet tube and an outlet pipe connected to the opaque sealed chamber; and
a photomultiplier tube installed on top of the opaque sealed chamber to measure an optical signal.

17. The ultrasonic/megasonic cleaning device according to claim 1, wherein the time range is configured at 180 ms-200 ms.

18. The ultrasonic/megasonic cleaning device according to claim 1, wherein the second frequency is the first frequency multiplied by an integer equal to or greater than 2.

* * * * *